Aug. 29, 1961 F. H. SCHEELER ET AL 2,997,948

PRINTED CIRCUIT PRINTING MACHINE

Filed Nov. 28, 1956 18 Sheets-Sheet 1

INVENTORS.
Frederick H. Scheeler
Roy J. Carrozza

By J. W. Douglas
Their ATTORNEY

Aug. 29, 1961 F. H. SCHEELER ET AL 2,997,948

PRINTED CIRCUIT PRINTING MACHINE

Filed Nov. 28, 1956 18 Sheets-Sheet 2

INVENTORS:
Frederick H. Scheeler
Roy J. Carrozza

By J. D. Douglas
Their ATTORNEY

PRINTED CIRCUIT PRINTING MACHINE

Filed Nov. 28, 1956 18 Sheets-Sheet 3

INVENTORS.
Frederick H. Scheeler
Roy J. Carrozza
By J. D. Douglas
their ATTORNEY

PRINTED CIRCUIT PRINTING MACHINE

INVENTORS:
Frederick H. Scheeler
Roy J. Carrozza

By J. D. Douglas
Their ATTORNEY

Aug. 29, 1961 F. H. SCHEELER ET AL 2,997,948

PRINTED CIRCUIT PRINTING MACHINE

Filed Nov. 28, 1956 18 Sheets-Sheet 5

INVENTORS.
Frederick H. Scheeler
Roy J. Carrozza
By J. D. Douglas
Their ATTORNEY Aug. 29, 1961 F. H. SCHEELER ET AL 2,997,948

PRINTED CIRCUIT PRINTING MACHINE

Filed Nov. 28, 1956 18 Sheets-Sheet 6

INVENTORS.
Frederick H. Scheeler
Roy J. Carrozza
By J. D. Douglas
their ATTORNEY

PRINTED CIRCUIT PRINTING MACHINE

Filed Nov. 28, 1956 18 Sheets-Sheet 7

INVENTORS.
Frederick H. Scheeler
Roy J. Carrozza
By J. U. Douglas
their ATTORNEY

PRINTED CIRCUIT PRINTING MACHINE

Filed Nov. 28, 1956 18 Sheets-Sheet 8

INVENTORS.
Frederick H. Scheeler
Roy J. Carrozza
By J. W. Douglas
Their ATTORNEY

PRINTED CIRCUIT PRINTING MACHINE

Filed Nov. 28, 1956

18 Sheets-Sheet 9

INVENTORS:
Frederick H. Scheeler
Roy J. Carrozza

By J. D. Douglas
Their ATTORNEY

PRINTED CIRCUIT PRINTING MACHINE

Filed Nov. 28, 1956

18 Sheets-Sheet 10

INVENTORS.
Frederick H. Scheeler
Roy J. Carrozza

By J. N. Douglas
Their ATTORNEY

Aug. 29, 1961 F. H. SCHEELER ET AL 2,997,948

PRINTED CIRCUIT PRINTING MACHINE

Filed Nov. 28, 1956 18 Sheets-Sheet 11

INVENTORS.
Frederick H. Scheeler
Roy J. Carrozza
By J. N. Douglas
their ATTORNEY

PRINTED CIRCUIT PRINTING MACHINE

INVENTORS.
Frederick H. Scheeler
Roy J. Carrozza

By J. D. Douglas
their ATTORNEY

PRINTED CIRCUIT PRINTING MACHINE

Filed Nov. 28, 1956 18 Sheets-Sheet 13

INVENTORS.
Frederick H. Scheeler
Roy J. Carrozza
By J. W. Douglass
their ATTORNEY

PRINTED CIRCUIT PRINTING MACHINE

Filed Nov. 28, 1956 18 Sheets-Sheet 14

INVENTORS:
Frederick H. Scheeler
Roy J. Carrozza
By J. W. Douglass
Their ATTORNEY

PRINTED CIRCUIT PRINTING MACHINE

Filed Nov. 28, 1956 18 Sheets-Sheet 15

INVENTORS.
Frederick H. Scheeler
Roy J. Carrozza
By J. D. Douglas
Their ATTORNEY

PRINTED CIRCUIT PRINTING MACHINE

Filed Nov. 28, 1956 18 Sheets-Sheet 16

INVENTORS.
Frederick H. Scheeler
Roy J. Carrozza

By J. D. Douglas
their ATTORNEY

PRINTED CIRCUIT PRINTING MACHINE

Filed Nov. 28, 1956

INVENTORS.
Frederick H. Scheeler
Roy J. Carrozza
By J. N. Douglas
their ATTORNEY Aug. 29, 1961 F. H. SCHEELER ET AL 2,997,948

PRINTED CIRCUIT PRINTING MACHINE

Filed Nov. 28, 1956 18 Sheets-Sheet 18

INVENTOR.
Frederick H. Scheeler
BY Roy J. Carrozza

J. W. Douglas
their ATTORNEY 2,997,948

PRINTED CIRCUIT PRINTING MACHINE

Frederick H. Scheeler and Roy J. Carrozza, Chicago, Ill., assignors to Admiral Corporation, Chicago, Ill., a corporation of Delaware Filed Nov. 28, 1956, Ser. No. 624,823

5 Claims. (Cl. 101—126)

The present invention relates to printing presses of the class employed for screen printing. In greater detail, it comprehends mechanism for printing on plate-like blanks and includes magazine means for containing a supply of the blanks from which a blank is removed as often as a printing operation is performed, and is transferred to a station where the blank is printed after which operation the blank is transferred away from the press, all of the operations being effected either automatically and in timed sequence or at the will of an operator.

Although screen printing presses are not new, none having the capacity of automatically feeding plate-like blanks from a magazined supply and manipulating them with adequate precision to print the blanks with the precision called for in "printed" circuitry is known.

Due to the present invention, a printing press has been provided which has the capacity of retaining a supply of printed circuit blanks or boards in a magazine from which the blanks may be withdrawn and severally passed to a printing station where they are accurately and regularly positioned in a predetermined relation to a printing couple and removed therefrom after a printing operation has been performed on them and are then delivered to a conveyor or printed blank container, all of the operations being performed on the blanks automatically.

Other advantages of the invention will be set forth in part hereinafter and in part will be obvious herefrom, or may be learned by practice with the invention, the same being realized and attained by means of the instrumentalities and combinations pointed out in the appended claims.

The accompanying drawings, referred to herein, and constituting a part hereof, illustrate an embodiment of the invention, and together with the description, serve to explain the principles of the invention.

Figures 8, 9:
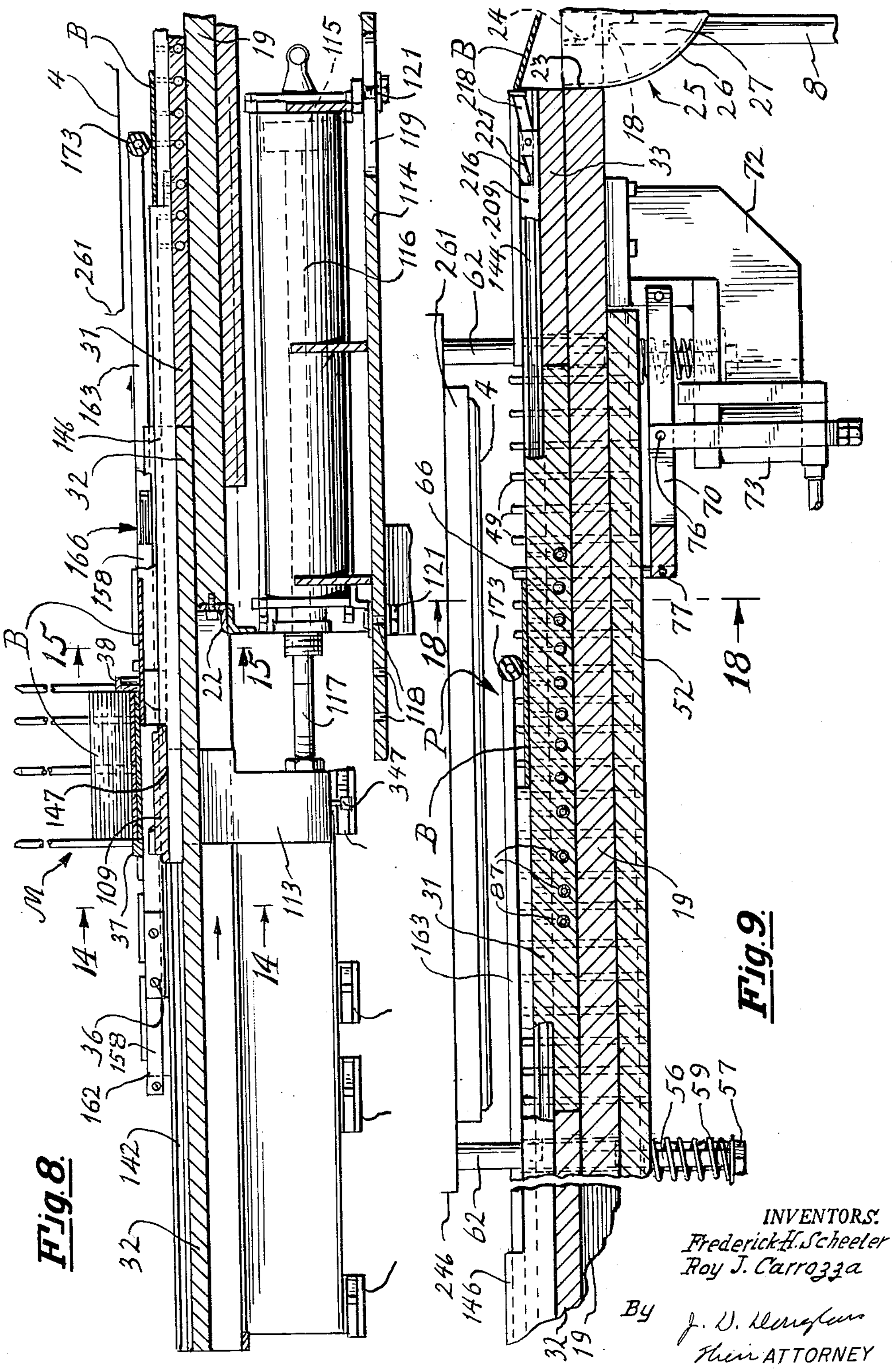
FIG. 8 is a fragmentary vertical section taken on line 8—8 of FIG. 6.
FIG. 9 is also a fragmentary vertical section taken on line 9—9 of FIG. 6.
Figure 10:
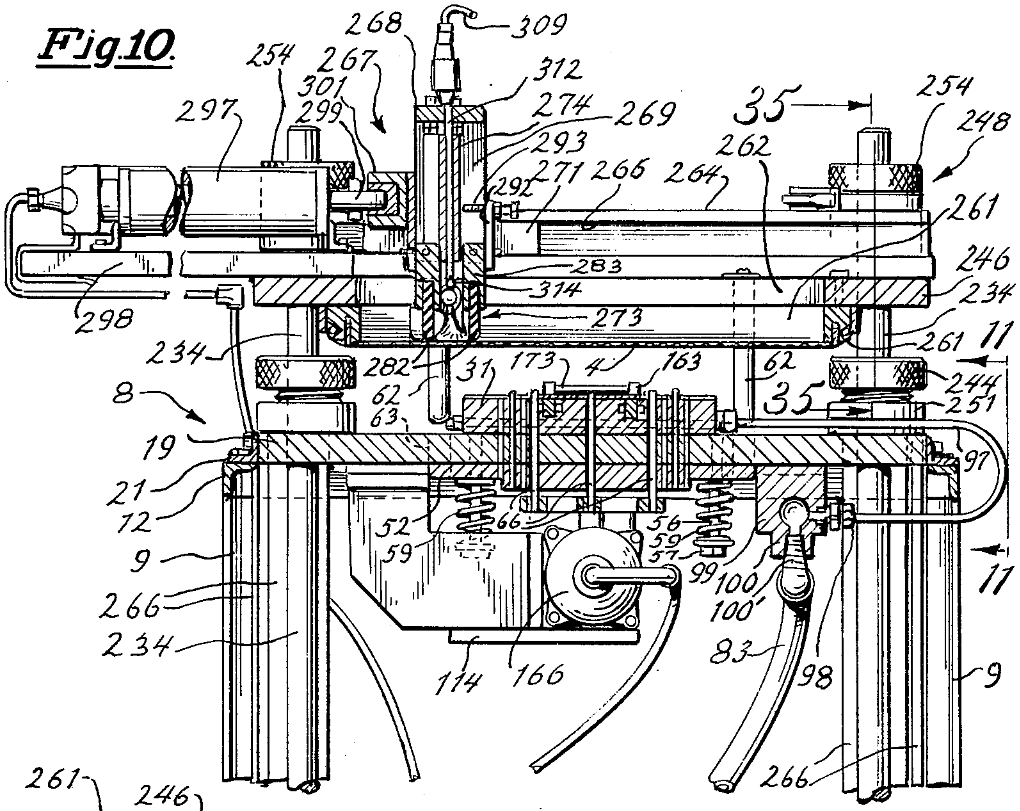
FIG. 10 is a fragmentary vertical section taken on line 10—10 of FIG. 2.
Figures 12, 12A, 13:
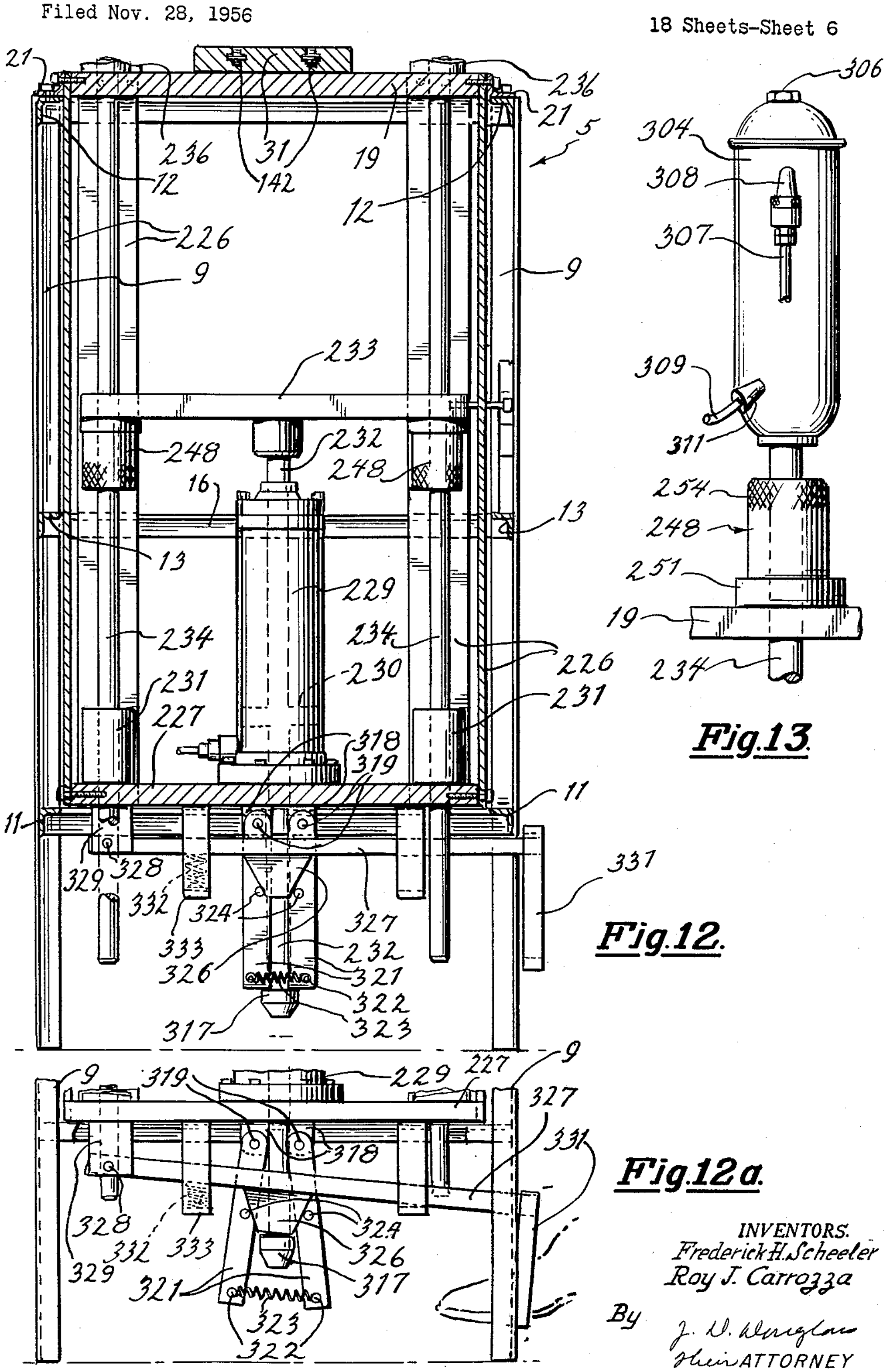
FIG. 12 is a vertical section taken on line 12—12 of FIG. 2.
Figures 14, 15:
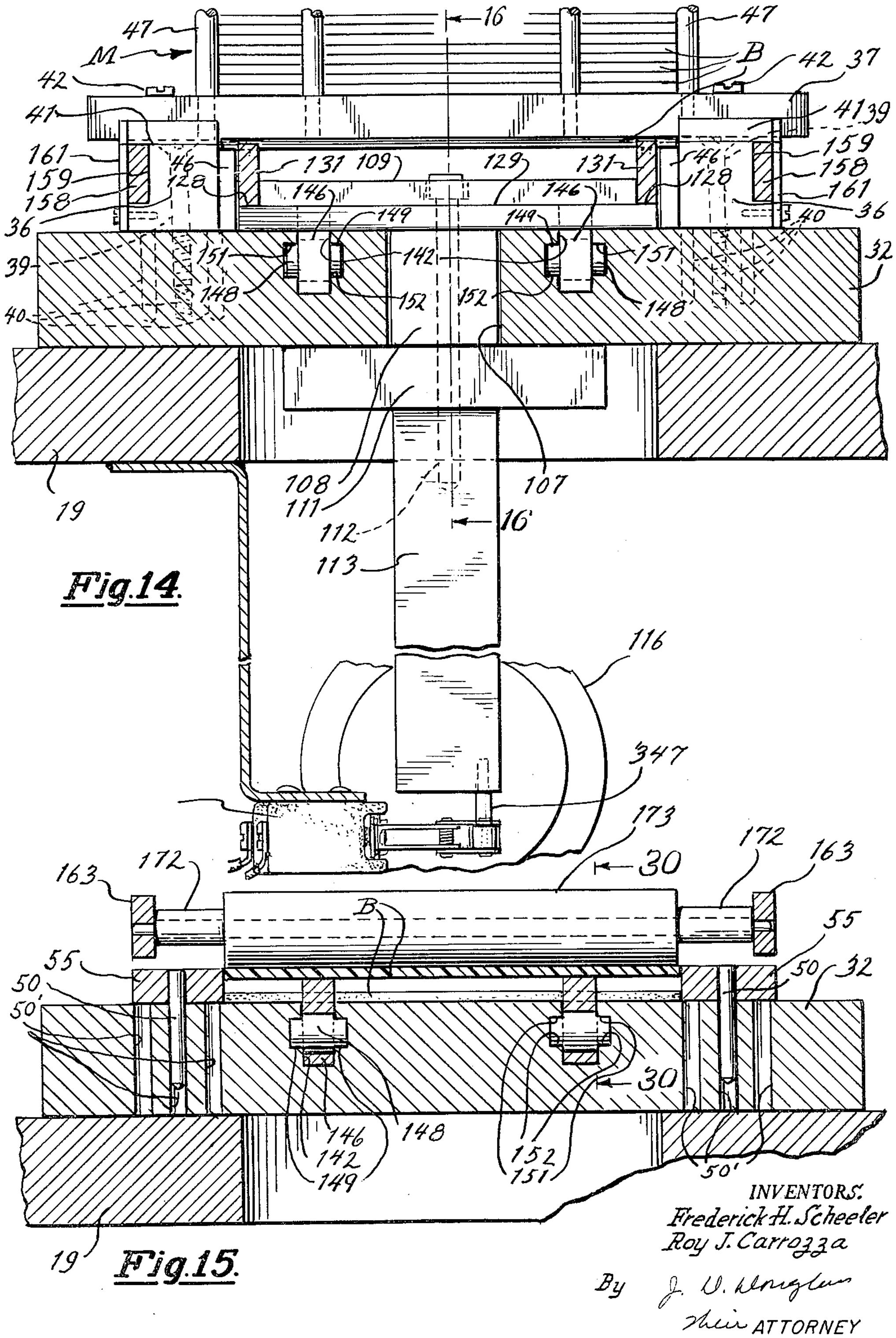
Figures 16, 17:
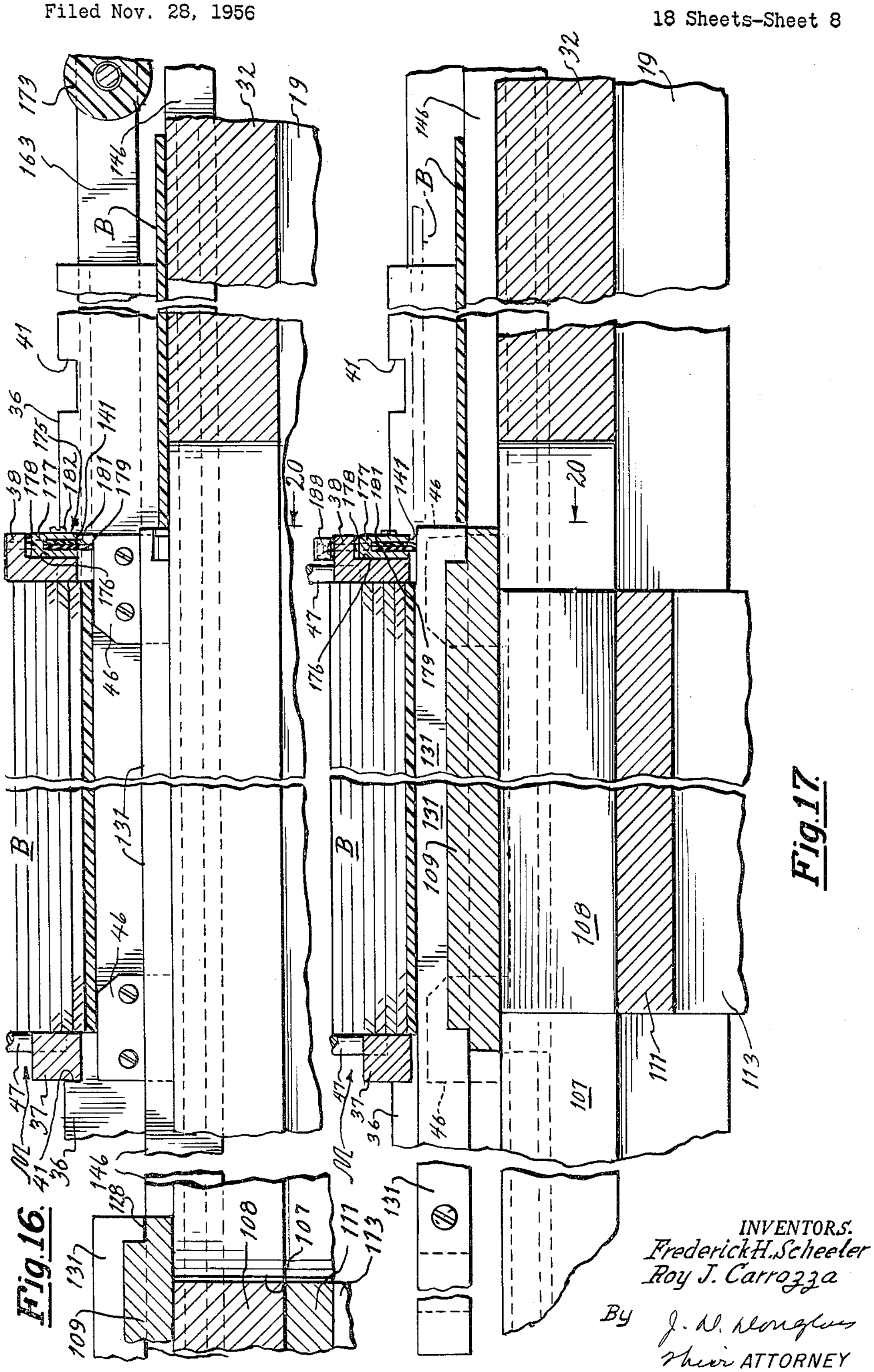
Figures 18, 19:
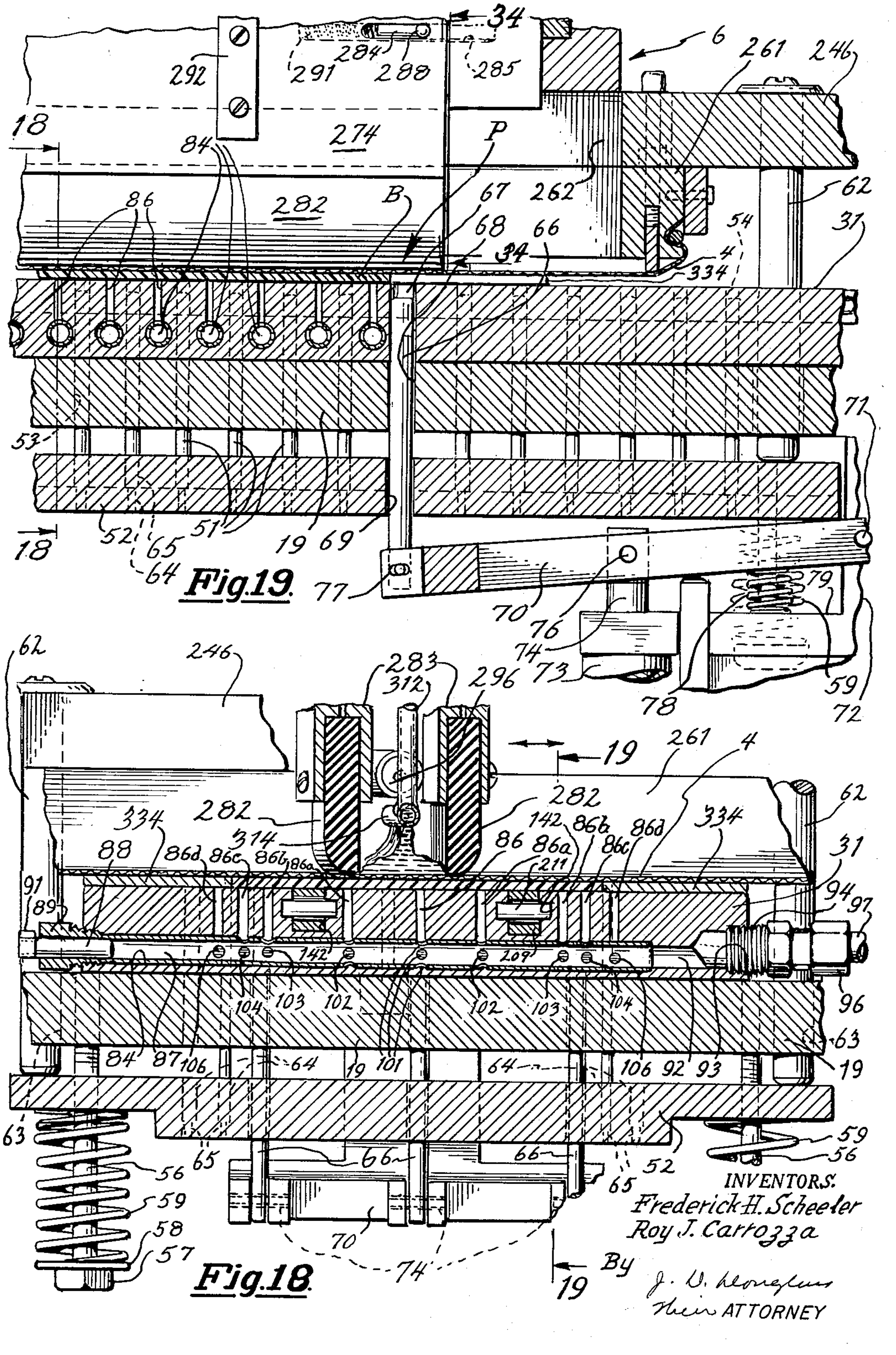
Figures 20, 21:
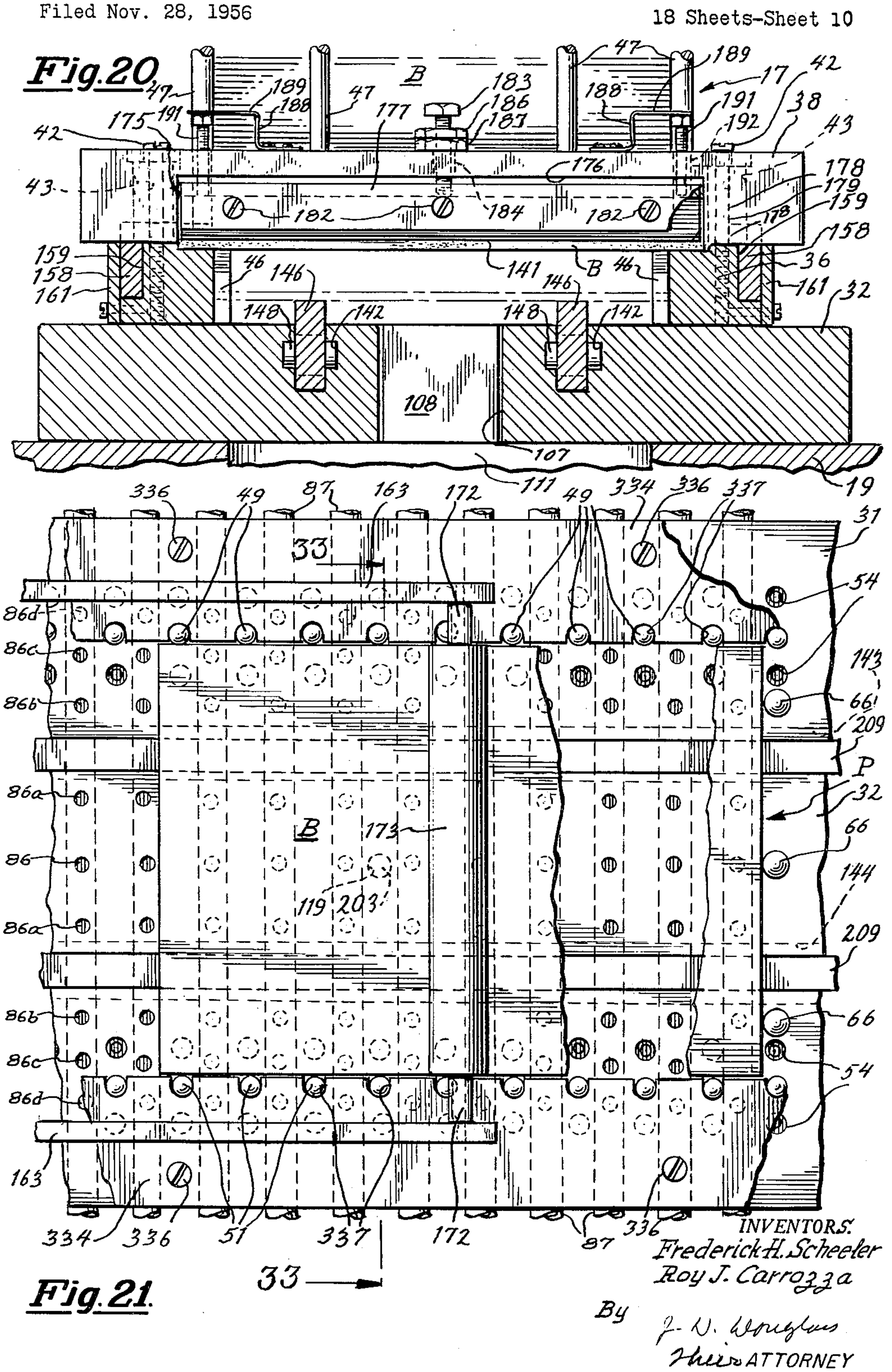
Figure 22:
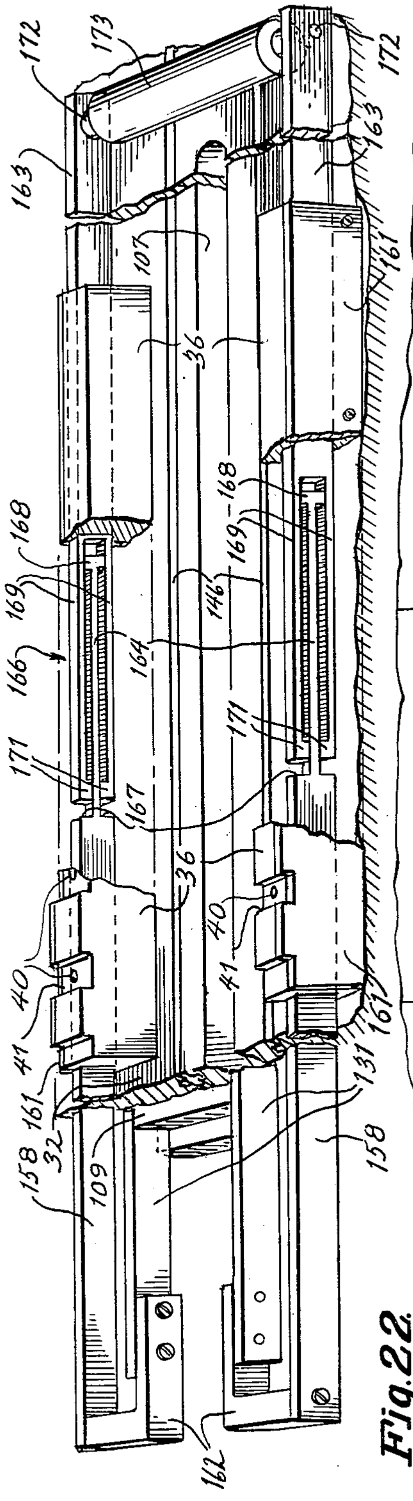
Figure 23:
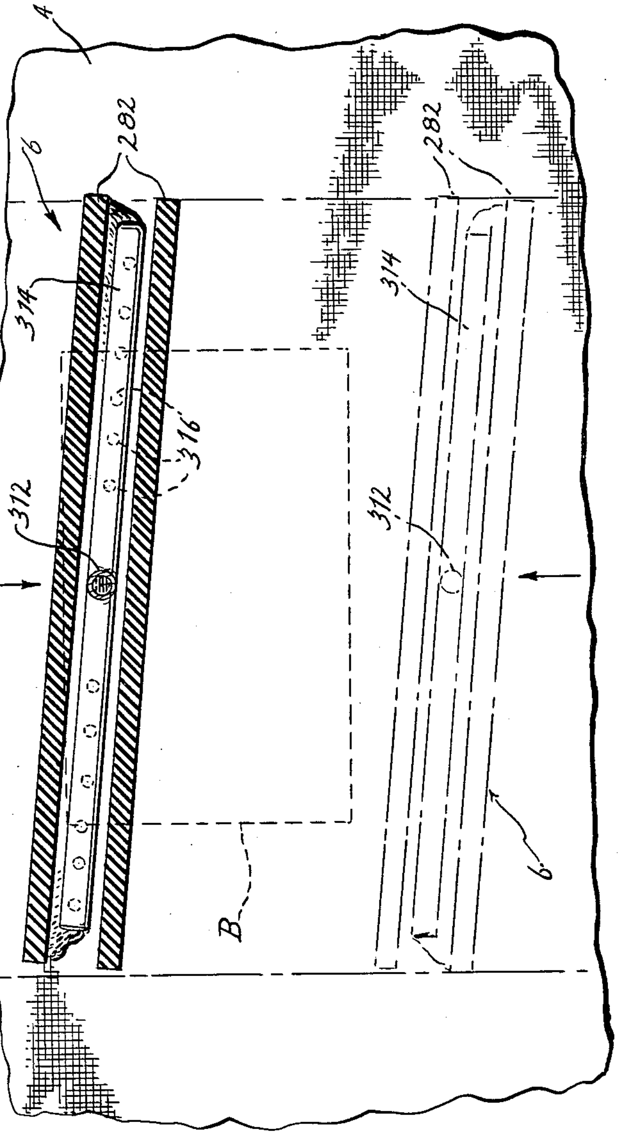
Figure 24:
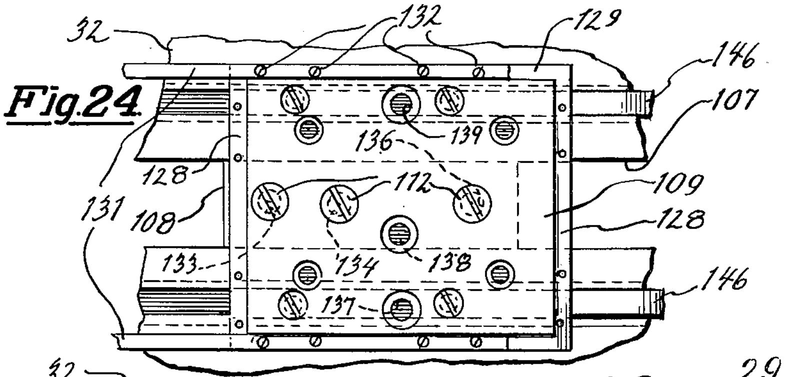
Figure 28:
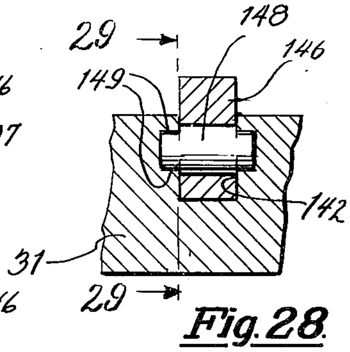
Figure 29:
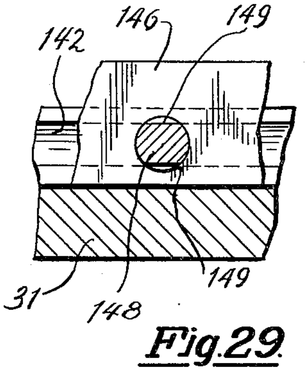
Figures 30, 31, 31A, 32:
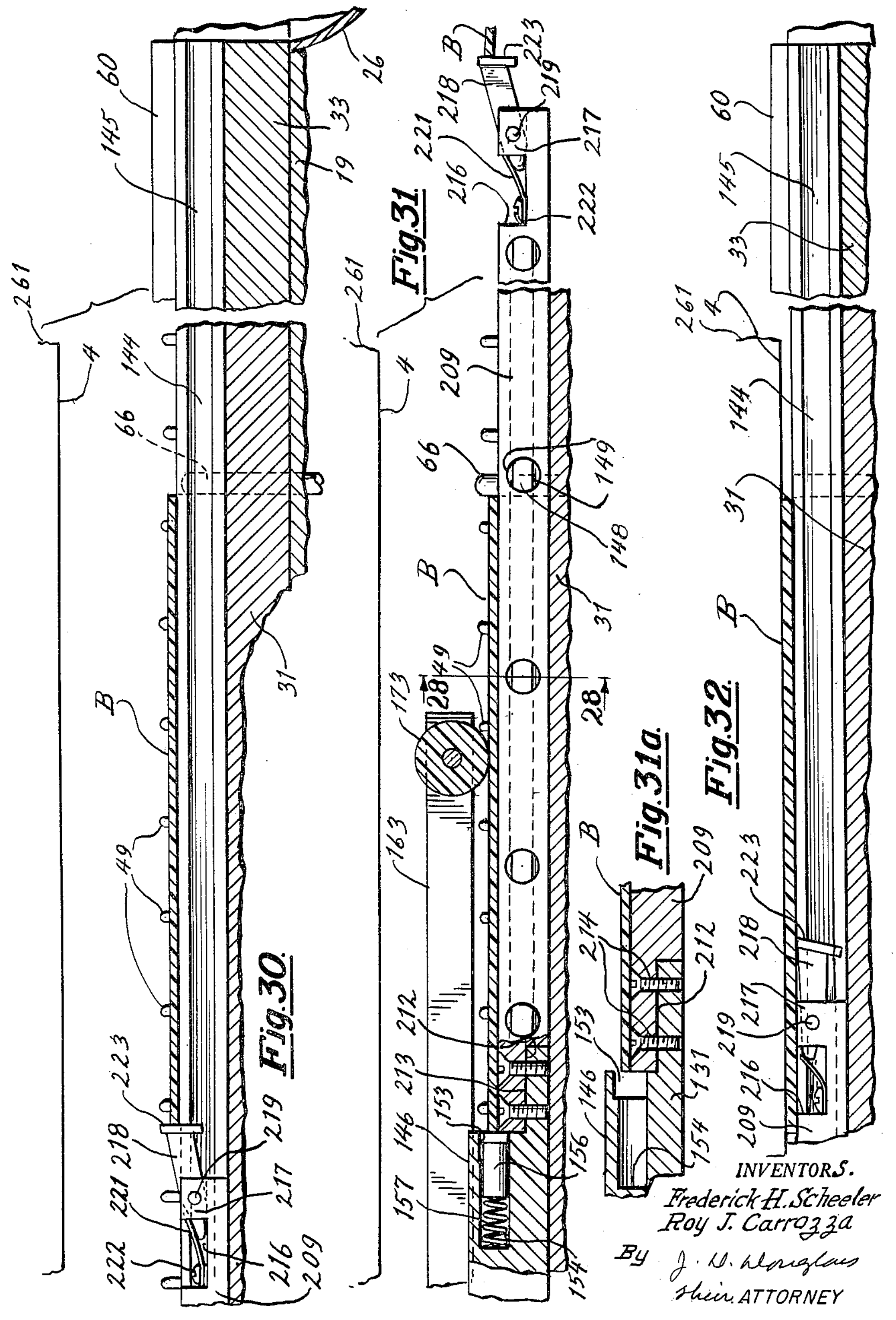
Figure 33:
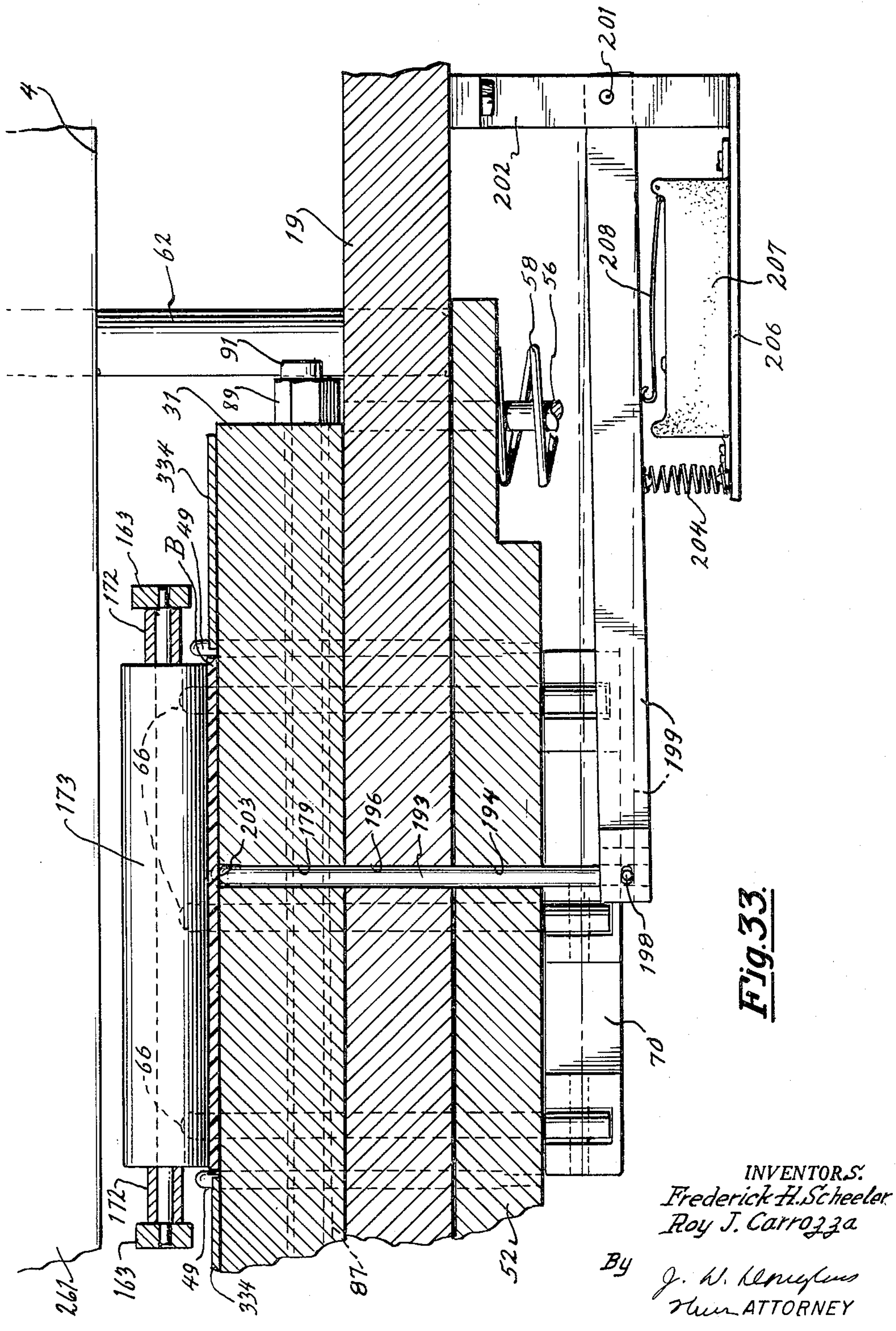
Figures 34, 35, 36:
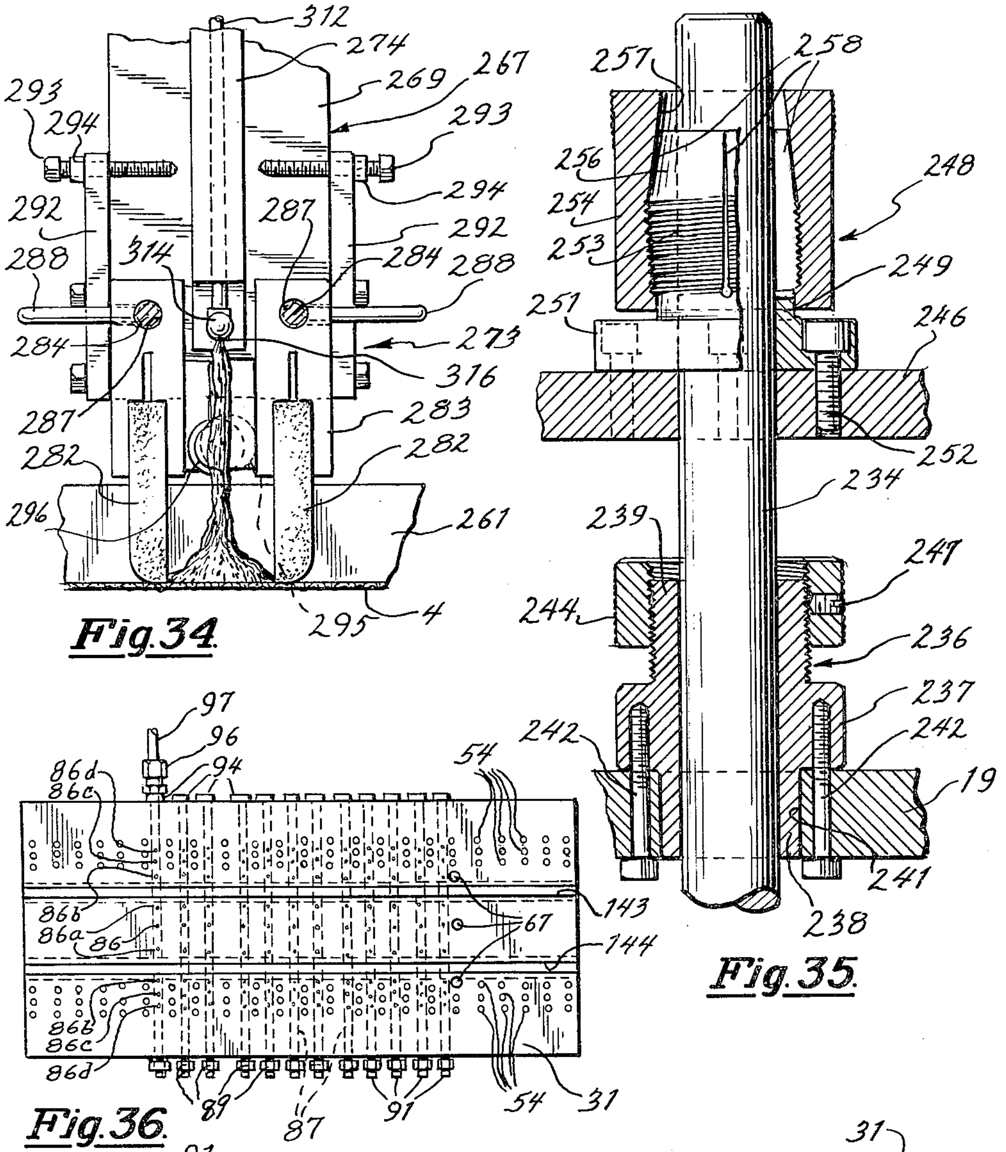
Figure 37:
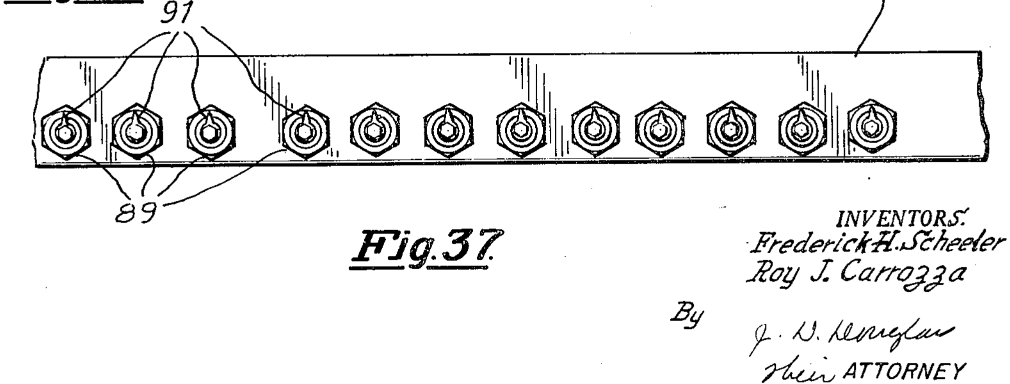
Figures 38, 39:
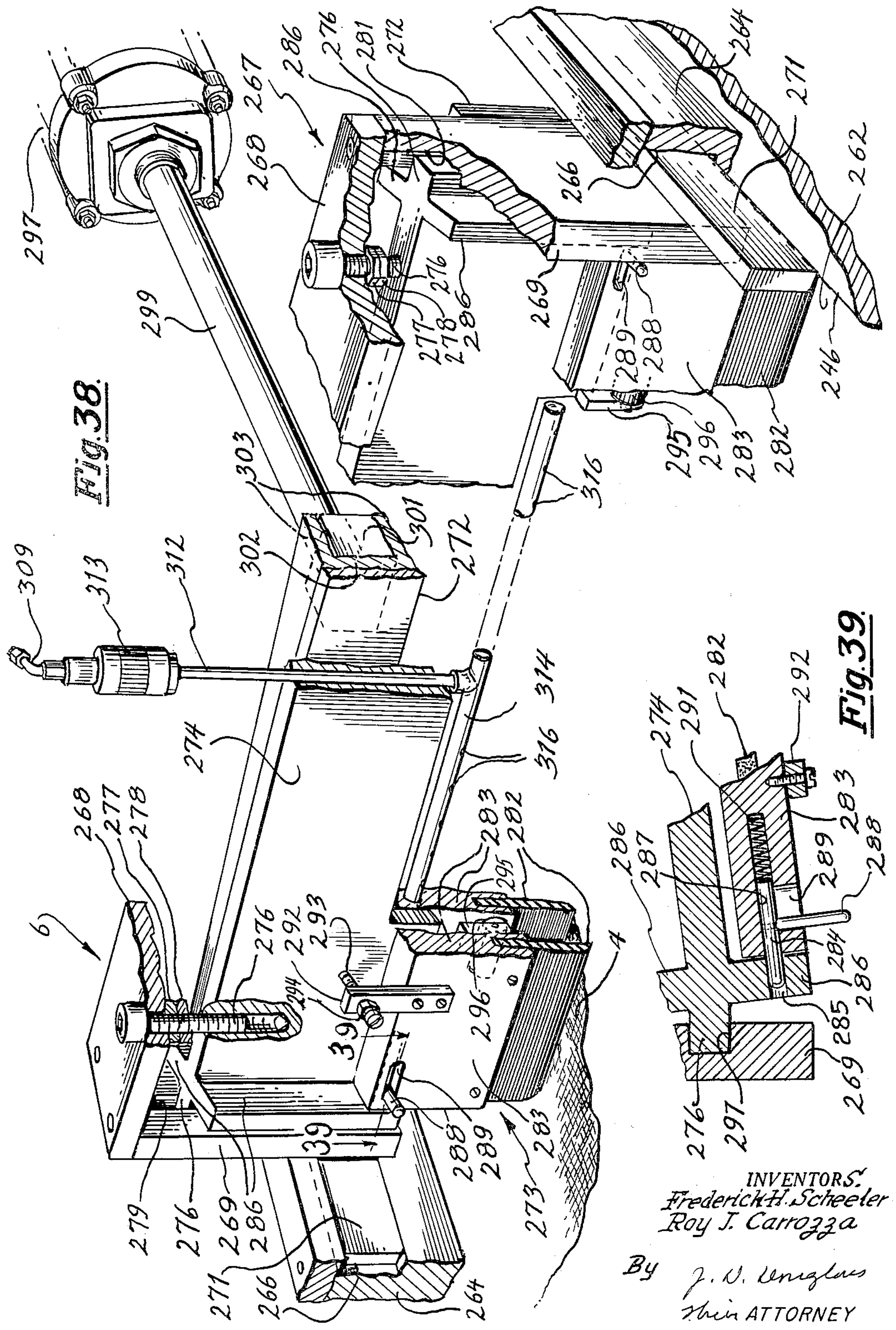
Figure 40:
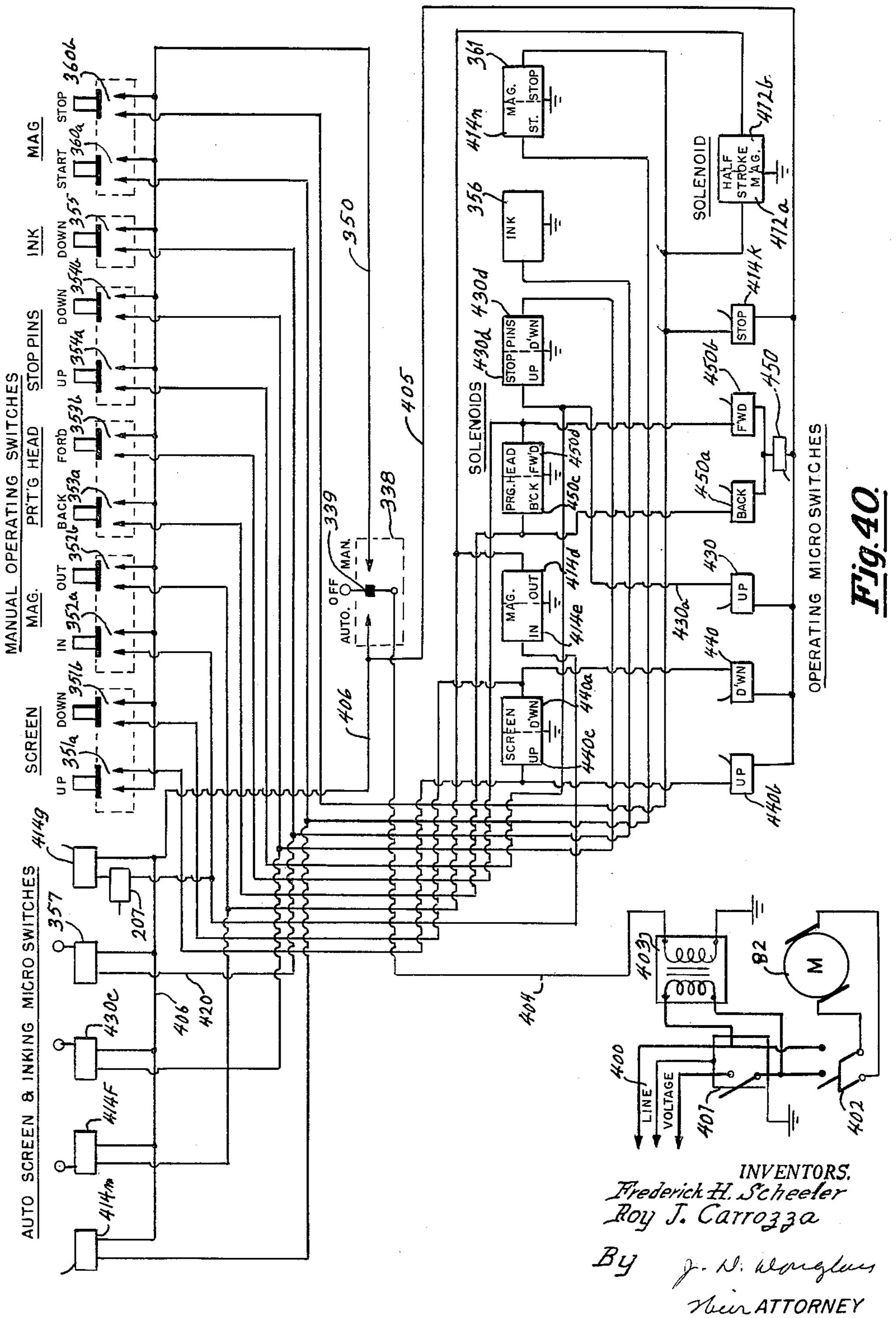
Figure 41:
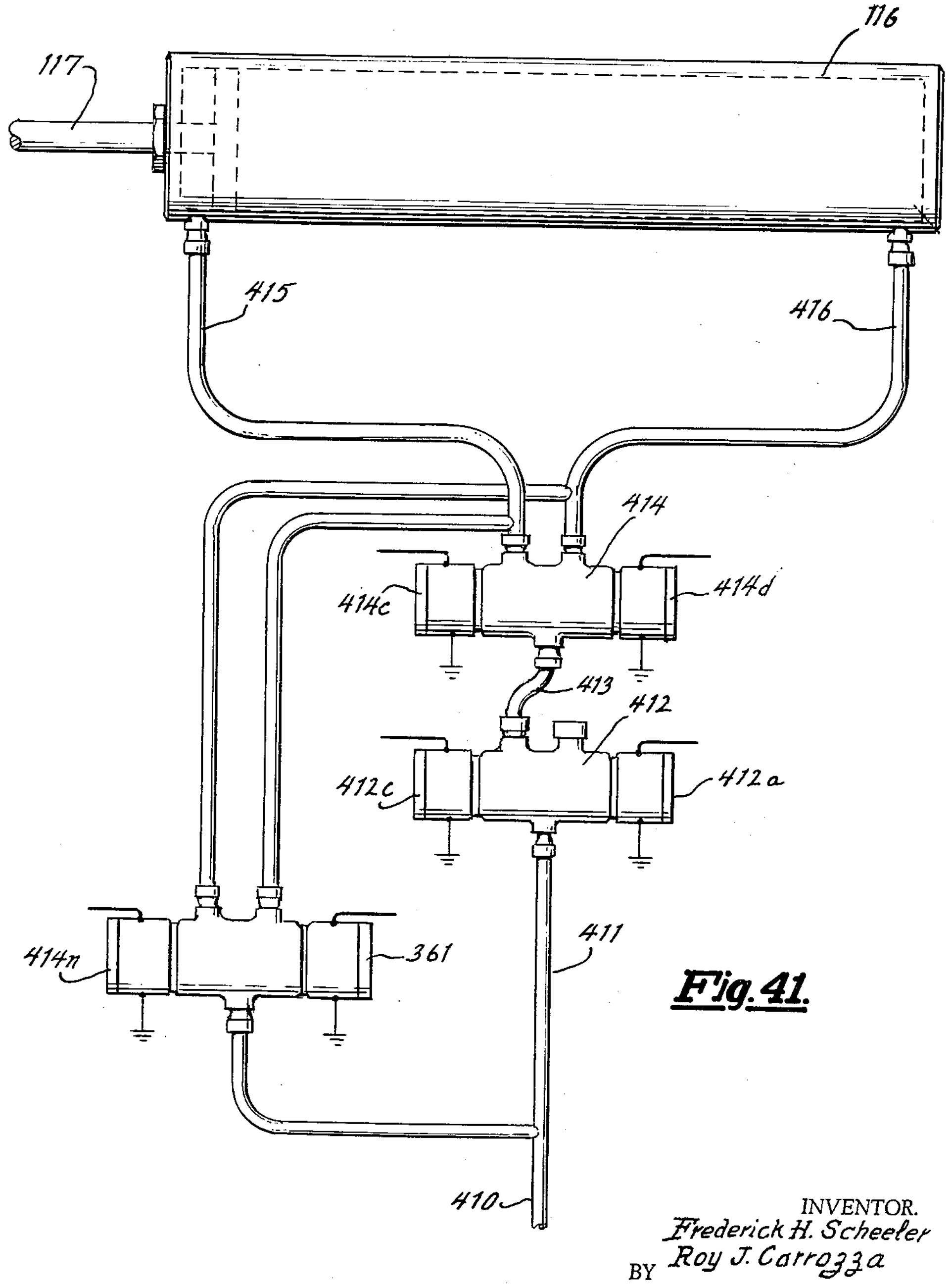

FIG. 12*a* is a fragmentary elevational view corresponding to the lower part of FIG. 12, parts being in different positions;

FIG. 13 is a fragmentary elevational view of the ink reservoir and mounting thereof;

FIG. 14 is a fragmentary vertical section taken on line 14—14 of FIG. 8;

FIG. 15 is also a fragmentary vertical section taken on line 15—15 of FIG. 8;

FIGS. 16 and 17 are fragmentary vertical sections taken on line 16—16 of FIG. 14, parts being in different positions in the respective views;

FIG. 18 is a fragmentary vertical section taken on line 18—18 of FIG. 9;

FIG. 19 is a fragmentary vertical section taken on line 19—19 of FIG. 18;

FIG. 20 is a fragmentary view, partly in section and partly in elevation, the whereabouts of which are indicated by line 20—20 of FIG. 17;

FIG. 21 is a fragmentary top plan view of the printing station at which some of the printing press parts are broken away;

FIG. 22 is a perspective view of the blank straightening mechanism, parts thereof and associated parts being broken away;

FIG. 23 is a top plan view of elements of the ink spreading mechanism, associated parts being broken away;

FIGS. 24 to 27 inclusive are top plan views of the saddle in different positions and associated parts broken away;

FIG. 28 is a fragmentary vertical section taken on line 28—28 of FIG. 31;

FIG. 29 is a fragmentary vertical section taken on line 29—29 of Fig. 28;

FIGS. 30, 31, 31*a* and 32 are vertical sections taken on line 30—30 of FIG. 15, parts occupying different positions in the respective views;

FIG. 33 is a fragmentary vertical section taken on line 33—33 of FIG. 21;

FIG. 34 is a fragmentary vertical section, partly in elevation, taken on line 34—34 of FIG. 19;

FIG. 35 is a fragmentary view partly in side elevation and partly in section taken on line 35—35 of FIG. 10;

FIG. 36 is a top plan view of the impression plate, a portion of which is broken away, as is also some of the parts connected thereto;

FIG. 37 is a fragmentary elevational view of the impression plate, drawn to an enlarged scale, and associated parts;

FIG. 38 is a fragmentary perspective view of the ink spreading mechanism, parts in association therewith being broken away;

FIG. 39 is a fragmentary horizontal section taken on lines 39—39 of FIG. 38;

FIG. 40 is a circuit diagram illustrating the switches, solenoids and their connections; and FIG. 41 is an elevational view illustrating a portion of the valving and pneumatic circuitry associated with the pneumatic motor or ejecting cylinder.

Figure 3:
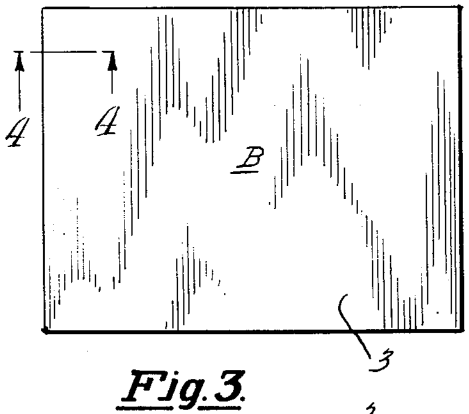
FIG. 3 is a top plan view of one of the blanks on which the machine is adapted to print.
Figure 5:
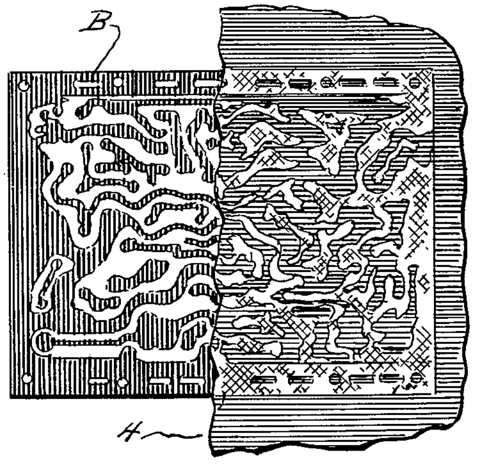
FIG. 5 is a fragmentary section of the printing press screen having a pattern printed thereon, the section being superimposed on a blank.
Figure 4:
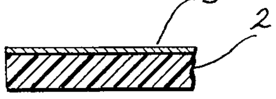
FIG. 4 is a fragmentary section taken on line 4—4 of FIG. 3.

In FIGS. 3 and 4 is indicated a plate-like blank or board B. It comprises a substantially rigid plate of some suitable dielectric material 2, such as Bakelite, about $\frac{1}{16}$ of an inch in thickness. To one side of the plate 2 is bonded a film of metallic copper 3 on which desired indicia may be printed by means of the novel printing press. After this operation, the copper is exposed to a metal dissolving agent to remove the unprinted metallic surfaces from the Bakelite, the ink being inert to the solvent. This is followed by treatment of the blank with an ink dissolving agent to remove the printed indicia and in lieu thereof expose a consequent copper indicia. The pattern or indicia applicable to the blank is provided on a screen 4 a section of which is indicated in FIG. 5. Since screen printing is old, intricacies thereof will not be dealt with. Nor will the structure of a novel frame for supporting and tensioning the screen be described, since it forms the subject matter of a co-pending application filed in the name of Frederick H. Scheeler on November 8, 1955, Serial No. 545,730, now U.S. Patent No. 2,925,774. The noteworthy features of the invention therefore reside in the printing press itself. It comprises a frame or housing indicated in its entirety by the character 5 to support a printing head or printing apparatus 6, from which is horizontally spaced a magazine M, to contain blanks B, from which a blank at a time may be delivered to the apparatus 6.

Figures 6, 7:
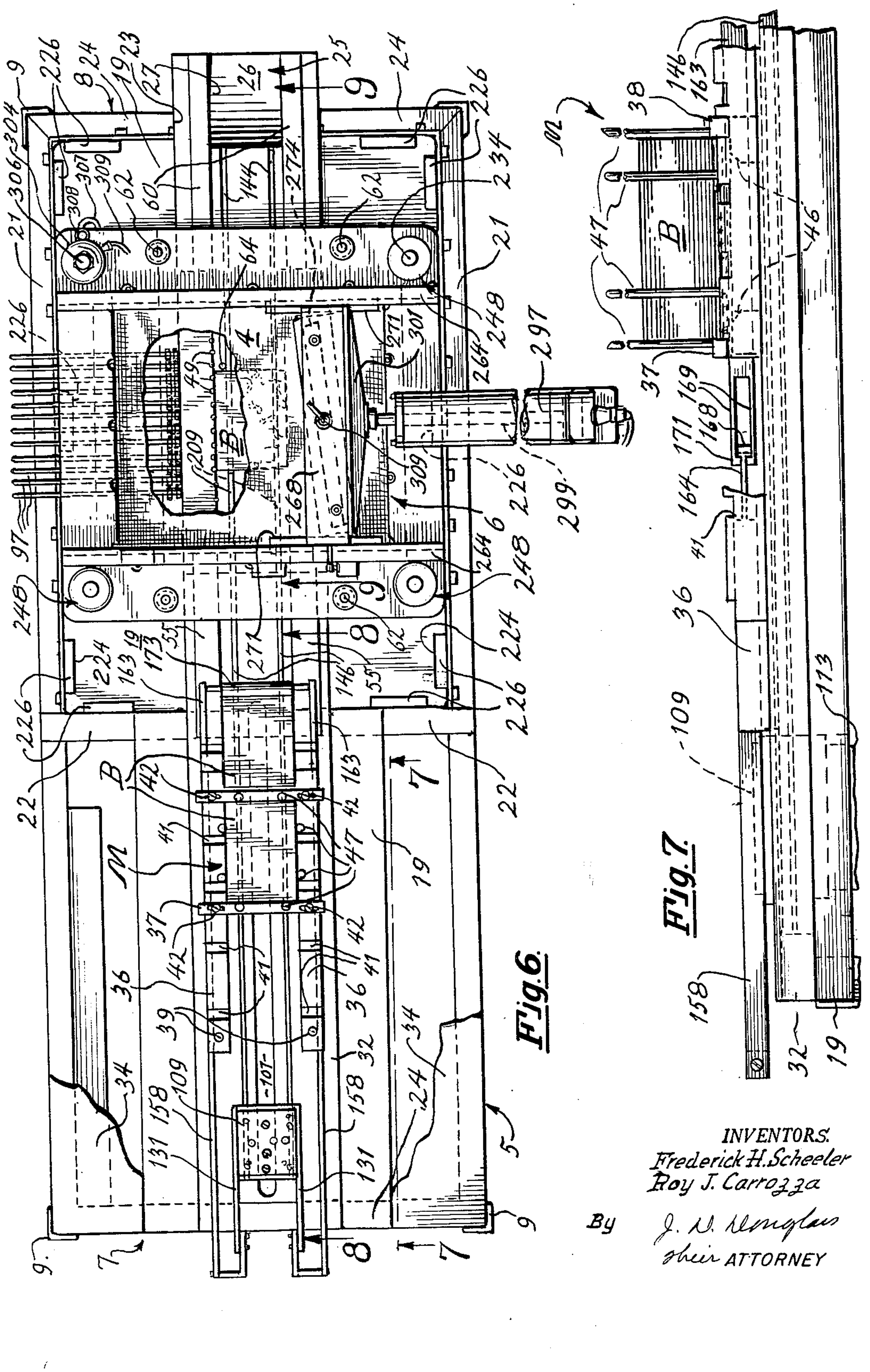
FIG. 6 is a top plan view of the machine, portions thereof being broken away.
FIG. 7 is a fragmentary vertical section taken on line 7—7 of FIG. 6.

Specifically, the frame 5 is of rectangular horizontal section which may be arbitrarily spoken of as having a loading or magazine end 7 and a release or delivery end 8. It further includes vertical corner members 9 spaced from each other at the longitudinal sides of the frame by lower members 11, upper members 12 and intermediate members 13. At both of the ends 7 and 8 the corner members 9 are tied to each other by lower members 14 and intermediate members 16. At its magazine end 7, the members 9 are spanned by a transverse member 17 at the top of the frame, while at the opposite end and top of the frame other means, later to be described, is resorted to to tie the tops of the members 9 together, the means including short members 18 spaced from but extending toward each other from the members 9. All of the members thus far referred to are of steel of L-shaped transverse cross-section and which are commonly referred to as angle irons. The ends of the members are preferably welded to each other at their points of junction. Adjacent its delivery end, the frame 5 supports a horizontal support plate 19. It is best shown in FIGS. 6 and 12. To opposed edges of plate 19, at the longitudinal sides of the frame, are fixed additional lengths of angle irons 21, which also overlie the members 12, with which said irons are in fixed relationship. Intermediate its ends, the frame includes a transverse angle iron 22, also fixed to plate 19. The remaining and delivery end of the plate 19 is formed with a notch 23, FIG. 9; the ends of the plate on either side of the notch have angle iron sections 24 secured thereto which, in turn, are fixed to the members 18. The plate 19 therefore aids in securing the upper ends of the members 9 together, while the notch 23 receives, fixed therein, a chute or guard 25, of sheet metal having a curved bottom wall 26 and vertical side walls 27 on either side of a rotary conveyor 28 to receive printed blanks and carry them away from the machine.

The plate 19 is superimposed by an impression plate 31, FIGS. 8 and 9 between a first guide plate 32, extending to the loading end of the frame, and a second guide plate 33 extending to the delivery end of the frame, the plates 32 and 33 being coplanar with the plate 31 and contiguous to the end thereof. All of the plates 31, 32 and 33 are fixed to the frame 6 by any suitable means. If desired, the top of the frame 6, on either side of the plate 32, may bear a plate 34 FIG. 6 of relatively thin sheet metal to afford table or support surfaces.

The magazine M includes a pair of longitudinal base members or superimposed rails 36, FIG. 14, and a pair of superimposing rails or transverse members 37 and 38, FIG. 7. The rails 36 are arranged in parallel relation to each other, as are the rails 37 and 38, to define a space within which one or more blanks B of common width are received in horizontal position. The rails 36 are anchored to the plate 32 by screws 39 passing freely through the ends of the rails and threaded in said plate. In greater detail, the plate 32 is provided with transverse rows of threaded holes 40 (FIG. 14) beneath both ends of the respective rails 36. In arranging the magazine for blanks of a given width, the screws are anchored in selected pairs of the holes 40 to space the rails for accommodation therebetween of the particular blank to be magazined.

Provision is also made for clamping the rails 37, FIG. 6, to the rails 36 in a selected position in accordance with the length of the blanks. The provision involves a plurality of notches 41 in which the rails 37 are selectively clamped by screws 42 passing freely through slots 43, FIG. 20, in the rails 37 and 38, below which the screws are threaded in the rails 36. While a stack of blanks is in the magazine, the bottommost of the blanks rests on a pair of spaced supports or brackets 46, FIGS. 14 and 16, on the inner side of each of the rails 36. The brackets 46 support the stack at an elevation wherein the bottom blank thereof is slightly below the level of the rails 37 and 38 by more than the thickness of one blank and less than the thickness of two blanks, so that the bottom blank may be removed from the magazine by sliding it longitudinally thereof out from between the remaining magazined blanks and the brackets 46, by mechanism to be described hereinafter without removal of any of the other magazined blanks. Following removal of a bottom blank, the stack of blanks is, of course, lowered by the thickness of a blank and another blank assumes the role of bottom blank for ejection from the stack. In order that the height of the magazined blanks may be considerably above the level of the rails 36 and 37 and be guided downward into the space defined by said rails as the blanks are repeatedly ejected, the magazine includes a fence structure provided by two or more spaced vertical rods 47 extending vertically from each of the rails 36, 37 and 38. If desired, the upper ends of the rods 47 may be slanted as at 48, FIG. 7, to cam a group of blanks inwardly of the fence structure as they are introduced into the magazine.

From the magazine M the blanks B are passed over the bed plates 32, 31, and 33, FIGS. 8 and 9, by mechanism later to be described, in a predetermined linear course. Beneath the head 6, the course is defined within minute limits by pairs of removable fences provided by a row of pins 49, FIG. 21, on one side of the course, and a row of similar pins 51 on the opposite side of the course. The pins are threaded at their lower ends in a fence carrier or horizontal plate 52, FIG. 9. Therefrom the pins extend vertically and pass freely through bores 53, FIG. 19, in the plate 19, and through bores 54, in the plate 31. The plate 19, in turn, bears a pair of spaced guide bolts 56, FIG. 18, extending downward therefrom on either side of the pins 49 and 51. The bolts also pass freely through the plate 52 below which they have heads 57 supporting washers 58. Between the plate 52 and each of the washers 58 a compression spring 59 is coiled about each of the bolts and serves to bias the plate 52 into juxtaposed relation to the plate 19. While the plate 52 is in its normal or non-printing position, the upper extremities of the pins 49 and 51 extend to a level slightly above the level of the upper side of a blank B on the impression plate 31, as will be noted in FIG. 9. From this position the pins may be moved downward until their upper extremities are below the level of the upper surface of the impression plate, as will be noted in FIG. 19. This movement is necessary in order that the pins 51 may not interfere with the printing head 6 when it is moved downward to the blank B. Therefore, the head 6 is provided with a plurality of fingers 62 which extend downward therefrom closely spaced from the plate 52. During a printing operation of the head 6, they are carried downward from a normal position into engagement with the plate 52 to move it downward against the force of the springs 59 thereby to remove the upper end of the pins 51 to a level below the upper surface of the impression plate 31. On upward movement of the head 6, the pins 51 are, of course, returned to their normal position by the springs 59. During their downward operation, the fingers 62 straddle the plate 31 and pass through clearance apertures 63 in the plate 19 before they engage the plate 52.

Between the rows of pins 49 and 51 and the magazine the course for the blanks is partly defined by a pair of bars 55, FIG. 15, of rectangular cross-section, fixed to the impression plate 32. Between the rows of pins 49 and 51 and the conveyor 28, the course is defined by a second pair of bars 60 fixed to the plate 33. Their proximity to each other may also be adjusted since the bars 55 have pins 50 extending downward therefrom for insertion in holes 50' in the plate 32, while the bars 60 have corresponding pins for insertion in selected corresponding holes in the plate 33.

The course defined by the pins 51 is of variable width to accommodate different sized blanks. For the course to be variable the bores 54 are in parallel rows at either side of said course, as are the bores 53. The plate 52, FIG. 19, is also provided with rows of threaded bores 64, downwardly of counterbores 65, to receive the lower ends of the pins 51 where they are selectively anchored.

When an ejected blank B is passed between the rows of pins 49 and 51, it is brought to a standstill at a printing station P beneath the printing head 6 only long enough for the latter to perform a printing operation on the blank. Then the blank is moved to the discharge conveyor 28. This pause in the movement of the blank below the ejector head is provided partly by means, later to be described, for ejecting the blank from the magazine and partly by retractable stops or stop pins 66, FIG. 19, between the row of pins 49 and 51. The stops 66 are operated independently of the pins 49 and 51 and so are slidably mounted in bores 67 in the plate 31, after passing through apertures 68, in the plate 19, and apertures 69, in the plate 52. Below the plate 52 a lever 70 is pivoted at 71 to a bracket 72 fixed to the lower side of the plate 19. The bracket also supports a solenoid controlled pneumatic motor 73, a piston 74 of which is pivotally coupled at 76 to the lever 70. And the lever 70 is pivotally connected at 77 to the pins 66. The stops 66 normally extend above the level of the plate 31 being in this position by the force of a compression spring 78 confined between the lever 70 and a horizontal surface 79 of the bracket 72. On engagement of the ejected blank B with the stops 66 the solenoid controlled motor 73 is energized. This is in response to closing of a switch, later to be referred to. The motor 73 then moves the lever 70 against the resistance of the spring 78 to move the stops 66 to a level below the top of the plate 31. This permits the head 6 to be lowered and a printing impression made on the blank. It also permits the printed blank to be discharged from the press, by apparatus later to be described, the blank being slid over the surface of the plate 31 above the tops of the pins 66. By this time fluid pressure to the motor 73 is cut off whereupon the pins 66 are restored to their normal positions by the springs 78.

At the printing station P, determined by the stops 66 and pins 49 and 51, an ejected blank is pulled downward against the impression plate 31 by the combined pressure of the atmosphere on the upper side of the blank and areas of greatly reduced air pressure below the blank. For this to be carried out, a base plate 81, FIG. 1, carried by the members 11 and 14, supports a vacuum pump 80 operated by a motor 82. Connected to the pump 80 is an intake pipe 85. It leads from a surge tank 341 from which an air inlet conduit 83 is also connected. Support for the tank 341 is provided by an intermediate platform 342 fixed to the members 13 and 16. The impression plate 31 is formed with a plurality of horizontal bores 84, FIG. 19, extending transversely of said plate. Additionally, the plate 31 includes a foraminous area on its upper surface, FIG. 36, provided by rows of vertical holes 86, each of which is directly above and in communication with one of the bores 84 at the printing station. As will be noted in FIG. 36, the holes 86 are also arranged in a row extending centrally and longitudinally of the impression plate, while on either side thereof and in symmetrical relation thereto are rows of holes 86*a*, FIG. 21. Nearer to the longitudinal edges of the plate 31 are additional rows of holes 86*b*, 86*c*, and 86*d*. The narrowest of three different sizes of printed circuit blanks B, when at the printing station P, covers the holes 86, 86*a*, and 86*b*. A blank B' of next greater width covers the holes 86, 86*a* 86*b* and 86*c*, while a blank B'' of greatest width overlies the holes 86, 86*a*, 86*b*, 86*c* and 86*d*. In FIG. 21 the pins 49 and 51 are spaced from each other to operatively accommodate a blank B' therebetween. For accommodation of blanks B the pins 49 and 51 would be moved to extend through the row of holes 54 nearest to each other, while for a blank B'' the pins 49 and 51 would be arranged to extend through the rows of holes 54 farthest from each other. The pins 66 are close enough to each other to need no alteration to their grouping when the size of blank, operated on by the machine, is varied.

Figure 11:
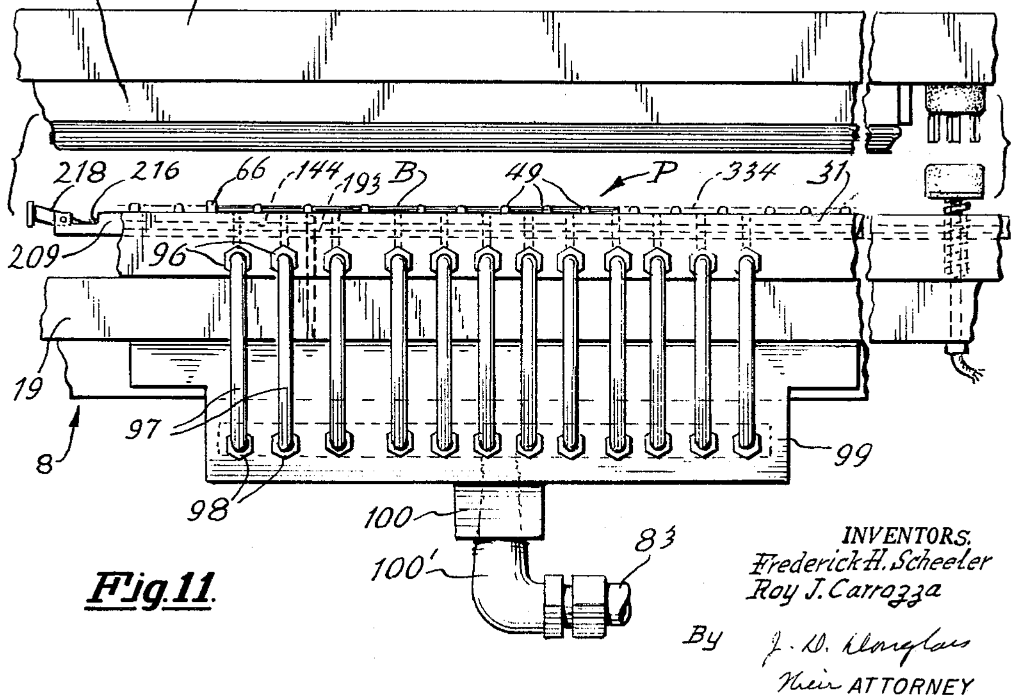
FIG. 11 is a fragmentary side elevation showing parts indicated in FIG. 1 from which the printing apparatus is spaced.

Means is provided for varying the number of rows of holes 86–86*d* inclusive to which suction is communicated. The means includes a separate sleeve valve or tube 87 in each of the bores 84 within which the tube is arranged to be turned. Each of the sleeves 87 is closed at one end thereof by a stub shaft or plug 88 fixed thereto. Each plug 88, on the other hand, passes through a pipe fitting 89 which is threaded in the plate 31. Additionally, the outer end of the shaft 88 bears a combined pointer and head 91, FIG. 37, adapted to receive a wrench, whereby the sleeve 87 may be turned and the angular adjustment thereof observed for a purpose later to be indicated. The remaining end of each of the bores 84, FIG. 18, is of diameter at 92 reduced to the internal diameter of the sleeve 87 and opens into a partly threaded counterbore 93 in which a threaded pipe fitting 94 is received. The fitting 94 also includes a nut 96 for securing one end of a pipe 97 in communication with the valve 87. The other end of the pipe 97 is connected by a fitting 98, similar to the fitting 94, to a manifold 99, FIG. 11, secured to the bottom of the plate 19. Each of the tubes 97 is similarly coupled to the manifold 99 while it, in turn, bears a hollow boss 100 in which a tubular elbow fitting 100' is threaded to couple the conduit 83 to the manifold.

The purpose of the valves 87, FIG. 18, is to preclude the flow of air through the uncovered rows of holes 86*c* and 86*d* when said outer rows are not covered by a blank in the printing station, yet provide for application of suction when it is desired to print blanks of greater width following printing of blanks of lesser width. Accordingly, each of the valves 87 is formed with a plurality of ports 101, 102, 103, 104 and 106 through which air, passing downward through the holes 86, 86*a*, 86*b*, etc., may enter the valve 87. For securing a blank B of greatest width to the plate 31, sleeve 87 would be rotated a quarter turn, from the position indicated in FIG. 18, to carry the ports 106, 104, 103, etc., into alignment with the holes 86*d*, 86*c*, 86*b*, etc., all of which are in line with each other. In this connection, it should be noted that there is but one port 106, on either side of the axis of plate 31 for imparting suction to the edges of a blank. Beside each of the ports 106 is a pair of ports 104, one of which is spaced 90° from the other. On the other sides of the respective ports 104 is a group of three ports 103 spaced 90° from each other. The remaining ports 102 and 101 are also in triplicate and spaced 90° apart. Thus, when the blank B is slid over the foraminous surface of the plate 31, air of the atmosphere presses the blank downward against the plate due to the low pressure of the air in the holes 86*c*, 86*b*, 86*a* and 86.

Although the foraminous area provided by the holes 86*d*,—86*d* is of width capable of being spanned by the width of the blanks thus far alluded to, the length of the area is too long to be spanned by the length of the blanks illustrated. This is to provide for use of blanks of length greater than those already referred to. Consequently, the effective length of the foraminous area is decreased from a point from the stops 64, which is less than the length of the particular blank to be printed. To understand how this is effected, it should be noted that the ports 106 are in line with the remaining ports, as are the ports 104. Also, the groups of ports 103 are angularly spaced from each other by 90° as are also the ports 102 and 101.

Approximately half of the circumference of each tube 87 is apertured while the remainder is a plain portion not shown in FIG. 19, since it is broken away. Preparatory to printing one of the blanks B, B′ or B″, those sleeves 87, not directly under the blank when it engages the stops 64, are rotated to position the plain side of the sleeve uppermost, thereby removing the possibility of air entering any of the holes **86–86*d*** not covered by the selected size of blank.

The blanks are transferred from the magazine M to the printing station by means best shown in FIG. 6. Therein it will be noted that the plate 32 is formed with a longitudinal slot 107 in which a filler or neck 108, FIG. 14, is received. The neck 108 is of depth minutely greater than the thickness of the plate 32 and formed to move freely longitudinally of the slot. The neck 108 is surmounted by a saddle or ejector plate 109 which the neck spaces from an anchor plate 111, below the plate 32 and of width greater than the width of the slot 107. The plates 109 and 111 are clamped to the neck 108 by a plurality of anchor bolts 112 passing freely through said plates and neck and threaded in an arm 113 extending downward from the plate 111. Spaced from the arm 113 and plate 111 and supported by brackets from the plate 19 is a motor base 114, FIG. 8. It is arranged to afford support thereon for a fluid pressure motor 116 having a piston rod 117 rigidly coupling the arm 113 to a motor piston 115. Provision for varying the stroke of the arm relative to the magazine includes a plurality of selectable apertures 118 and at least one slot 119 through which bolts 121 from the motor 116 may pass for releasably clamping the latter to the frame 5.

It will now be apparent that operation of the motor 116 imparts reciprocatory motion to the saddle 109 in a direction longitudinally of the plate 32. In the course of these cycles of oscillatory movement the saddle 109 is moved under the magazined blanks B, FIG. 17, and between the supports 46 of the magazine. On the backward movement of piston rod 117, i.e., in a direction from left to right, FIG. 8, the lowermost of the magazined blanks is ejected from the magazine. For this to be carried out, the thickness of the edge portions of saddle 109 is uniformly reduced as at 128 and 129, FIG. 14, to provide a continuous ledge on which a pair of ejector rods 131 is clamped, one each of the rods being secured at opposite sides of the saddle by screws 132, FIG. 24. The rods 131 are of such a width that, when attached to the support they may be accommodated between the supports 46, Fig. 14, and of an elevation, above the ledge 128, adequate to engage the lowest magazined blank, but insufficiently high above the ledge to engage the blank immediately next above the bottom blank when the motor 116 is operated.

Figures 25, 26, 27:
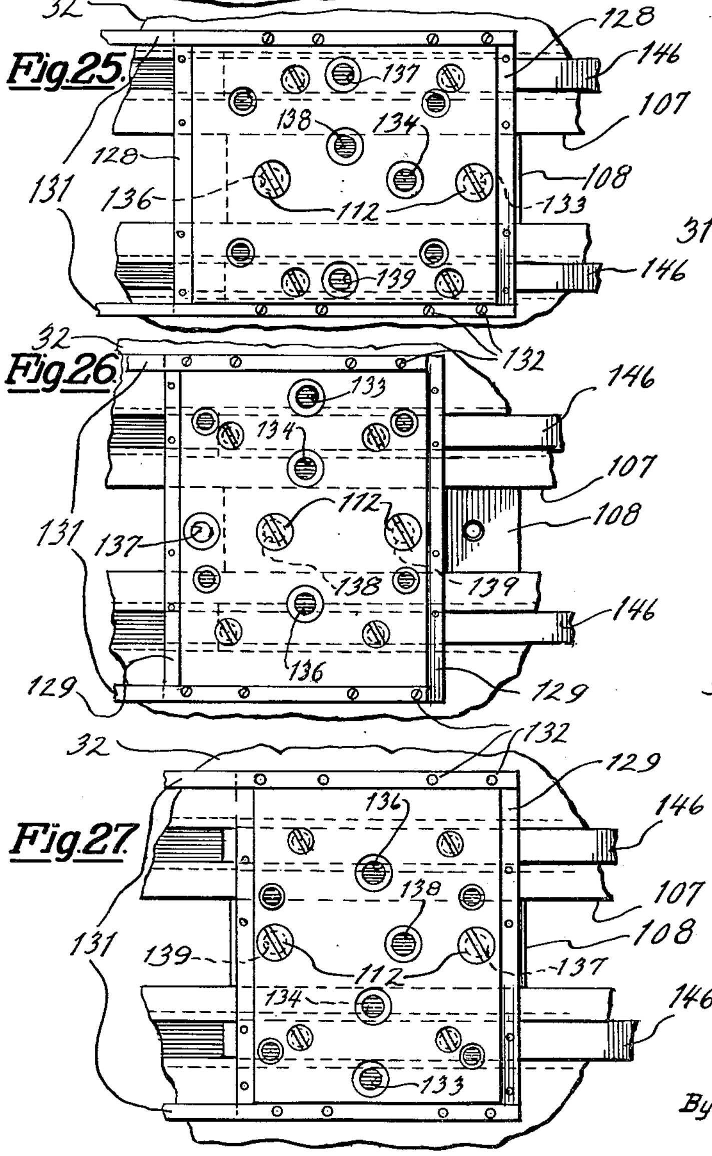

The saddle 109 is susceptible of support in a plurality of horizontal positions in each of which it may eject a blank of different dimensions. To understand how this is possible, reference is made to FIGS. 24 to 27 inclusive wherein it will be noted that the saddle is formed with a plurality of counterbored holes 133, 134 and 136 through each of which the anchor bolt 112 may pass to secure the saddle to the neck 108. As thus maintained in the position shown in FIG. 24 relative to which the magazine is to the right, the saddle 109 is in readiness for ejecting a blank of shortest length from the magazine. But the hole 133 is nearer the adjacent end of saddle 109 than is the hole 136 to the opposite end of the plate. Therefore, it will be evident that if the screws 112 are removed and the plate 109 swung through 180° and the bolts 112 then tightened that the saddle will be farther from the magazine than it was in its position first referred to. This is the position provided for a blank of medium length, and is indicated in FIG. 25. In FIGS. 26 and 27 a different set of holes 137, 138, and 139 are employed to receive the bolts 112 after the saddle has been turned through 90° from their FIG. 24 and FIG. 25 positions. In FIG. 26 the holes 138 and 139 only are used when clamping the plate 114 in a position still farther from the magazine to provide for ejecting the largest of three sizes of blanks from the magazine. The additional position shown in FIG. 27 is provided by passing the screws 112 through the holes 137 and 139, after the position of saddle 109 has been reversed relative to its FIG. 26 position. In the latter position, the plate is advanced toward the magazine M although the ejector rods 131 are spaced apart as they are in FIG. 26.

In FIGS. 16 and 17 is shown the effect of movement of the saddle 109 from a position to the left of the magazine M to a position thereunder when the saddle is at the forward end of its stroke and the piston rod 117 moved backward. This is accompanied by engagement of the trailing edge of the lowest magazined blank by the ends of the rods 131, following which said lowest blank is pushed, longitudinally thereof, by the advancing rods and thereby slid out from between the supports 46 and remaining magazined blanks and through a gate 141 on exit from the magazine defined horizontally as the space between the rails 36 and vertically as the space between the rail 38 and supports 46. Immediately after the blank is ejected the remaining magazined blanks temporarily rest on the rods 131 until the saddle, by adequate backward movement, carries the rods 131 out from beneath the remaining blanks and allows them to drop to the support of the supports 46. The next lowest blank then is in readiness to be similarly ejected from the magazine.

The blanks are ejected at a level higher than the top of the plate 32. And when ejected, they drop to the support of means, later to be described, where there is a pause in the motion of the ejected blank at a level intermediate that of the gate 141 and the top of plate 32. Since the pause in motion of a blank takes place at the end of a forward stroke of the rods 131, each of the ejected blanks is transferred from the magazine to the station P, two forward strokes of the saddle 109 are required to remove a blank and transfer it to the printing station. For this to be effected, the plate 32, on either side of and spaced from the slot 112, is formed with a slot 142, FIG. 18. The slots 142 are parallel to each other and also spaced from the supports 46 of the magazine. The impression plate 31 and plate 33 are also formed with slots 143 and 144, FIG. 36, similar in cross-section and arrangement to the slots 142, and the ends of the latter being in registration with the ends of the slots 143 and 144, a pair of virtually continuous slots are provided from the magazine to the conveyor 28. The slots 142 play the role of guides for a pair of conveyor rods 146 arranged therein for longitudinal movement. Their movement in the slots is derived from the saddle 109 to which they are fixed at the bottom thereof. For their relationship, the rods 146 are of reduced depth as at 147, FIG. 8, where they extend under the saddle. Elsewhere, the upper surfaces of the rods 146 are coplanar with the shoulders 128 and 129 of the saddle. The rods 146 are also supported by a plurality of anchor pins or keys 148, FIGS. 28 and 29, extending, at intervals, transversely of the rods 146 and formed with flats 149, externally of the rods 146 for bearing relationship to the respective upper and lower walls 151 and 152 which are lateral extensions of the slots 142. While the saddle is moving through its forward stroke, the rods 146 are moved to the right, FIG. 8, of the magazine and in this status are therefore in readiness to afford support for a blank as it is ejected from the magazine. The rods 146 then support the blank until they move out from under it on their return stroke. During the latter operation, the ejected blank is carried backward slightly into engagement with the vertical surfaces of the supports 46 which act as strippers to resist further backward movement of the blank under the magazine with the rods. The rods moving out from under the blank, it drops to the support of the plate 32 in front of the ends of the rods 146 as shown in FIG. 16. On the immediately next forward stroke of the saddle the ejected blank is engaged, by means later to be described, at the ends of the rod 146 and moved into the printing station. In its transit thereto, the blank passes between the inner pair of rows of pins 49 and 51, as previously indicated, until it engages the stops 66 at substantially the same time that the saddle 109 reaches the forward end of its stroke.

If desired, the ends of the rods 146 may move slightly more than adequate to move a blank into engagement with the stops 64 in which event cushioning means must be employed to avoid fracture or distortion of the ejected blank or machine parts. Therefore, both ends of the rods 146 are formed with an undercut or horizontal notch 153, FIG. 31*a*, adequate vertically to readily receive the edge of a blank. In extension from each of the notches 153 is a bore 154 in which a piston 156 and a compression spring 157 are confined, the spring biasing the piston into the notch. When the ejected blank is pressed against the stops 66, the pistons are thereby moved backward against the resistance of the springs 157 if the space between the pistons and stops is less than the length of the blank.

A blank which is thus passed to the printing station P is secured to the impression plate 31 by suction, as already indicated. The suction is effective for securing the ejected blank to the impression plate if said blank is flat. If, however, the plate is bowed upward transversely and centrally thereof so that its ends only engage the impression plate, the suction is ineffective for clamping it to said impression plate, therefore means is provided for depressing the blank by applying pressure thereto transversely of its central region. The means includes a pair of horizontal beams 158, FIG. 22, one of each being on opposite sides of the magazine M. For their supports, each of the rails 36 is formed with a groove 159, FIG. 14, in which one of the beams 158 is slidably received and in which the beams are confined by straps 161 bolted to the rails 36. The beams 158 are fixed to L-shaped members 162, FIG. 22, and they, in turn, are bolted to the rods 131 to provide reciprocatory motion for the beams 158. The grooves 159 also receive, for sliding motion therein, a second pair of beams 163 between which, and the beams 158, there is lost motion whenever the saddle 109 is moved through one of its strokes. This is provided by a section 164, of reduced depth, at the ends of both of the beams 158 and a bifurcated end portion 166, on both of the beams 163. By the reduction in depth, shoulders 167 are provided on the beams 158 at one end of the sections 164 while the opposite end of the latter is formed with a head 168 opposed sides of which are embraced by a pair of arms 169 of the bifurcated section 166. The end of the arms 169 are formed with fingers 171, extending toward each other into intimate association with the section 164. The remaining ends, of the beams 163, extend out of the rails 36 and have journaled therein pintles 172 of a roller 173.

As already indicated, an ejected blank is dropped to the support of the plate 32 from the rods 146 as the latter are moved backward to the end of their stroke. Thereat the front ends of the rods 146 are thus adjacent the trailing edge of the blank just stripped therefrom, as shown in FIG. 16, while the roller 173 is adjacent the leading end of the blank. The roller 173 is then at its nearest point to the magazine M and is carried to this position by the shafts 163 owing to engagement of the head 168, FIG. 22, with the fingers 171, the lost motion linkage 166 then being fully extended at the backward end of the stroke of beams 158 and 163.

It will now be apparent that as a forward stroke of the saddle 109 is initiated the rods 146 first engage the trailing edge of the blank and with their forward movement they push the blank under the roller 173. Also, early in the forward movement of the beams 158, the roller 173 does not change its position since the head 168 merely moves forward between the arms 169. By the time the shoulders 167 engage the fingers 171 the blank has been displaced, by the rods 146, to a point wherein the central region of the blank is under the roller. The coupling 166 is then contracted to its minimum and thereafter the forward movement of the beams 158 is communicated to the roller 173 which remains over the central region of the blank until it is transferred to the printing station and is in engagement with the stops 66, FIG. 31. Also, the roller is arranged at an elevation above the plates 32 and 31 to depress the blank into intimate relation to said plates, if the blank is warped upward at its mid region, so that the suction exerted in the foraminous area of the plate 31 is effective throughout the lower area of the blank for drawing it into clamped relationship to the impression plate.

In the course of handling or storage of the blanks B, dust or dirt often adheres to their surface. Since the dirt, especially if in the nature of metal filings may be detrimental to the process of printing, provision is made for removal of the dust from a blank before it is printed. This is carried out as the blanks are ejected from the magazine M and is best shown in FIGS. 17 and 20. Therein it will be noted that the supported member 38, of the magazine, is formed with a recess or undercut 176 on the outward side thereo. It is longer than the width of the largest blank and received therein wiping apparatus 175 including a wiper carrier or metal bar 177 of inverted U-shaped cross-section having a recess 178, extending upward from its lower edge throughout its length, in which a pair of wiper leaves, 179 and 181, preferably of rubber, are secured by screws 182, threaded in the outer side of the carrier. The carrier is supported above the level of the gate 141 by a vertical screw 183 threaded therein and passing freely through a bore 184 in the member 38. Thereabove, the screw 183 bears a locknut 186 and nut 187 for engagement with the top of the member 38 for support of the wiper 177. The latter therefore may be said to be floatingly coupled to the member 38. This enables the wiper to rock within limits, about the screw 183. The rocking is against spring pressure and this is provided by means including a pair of leaf springs 188, one of which is fixed to the supported member 38 on either side of and remote from the screw 183. Each of the springs 188 is formed with an offset portion 189, for cooperation with a screw 191 threaded in the carrier 177 and freely extending through a hole 192 in the member.

In operation, the rubber leaves extend into the gate 141, their degree of extension being regulated by adjusting the nut 187. When the wiping apparatus is lower on one side than the other, one of the screws 191 may, of course, be turned to adjust the position of the wiper to a state of uniformity and/or adjust the pressure exerted thereby on the blanks as they pass through the gate.

Should anything preclude the intimacy of engagement desired between a blank and the impression plate, by its presence therebetween so that the suction is ineffective for clamping the blank to its support at the printing station, then the printing apparatus 6 does not operate. This is due to a safety device best shown in FIG. 33. Therein it will be noted that a vertical pin 193 passes through a bore 194 in the plate 52, a bore 196 in the plate 19 and is also slidable in the plate 31, in a bore 197. The lower end of pin 193 is pivotally coupled at 198 to a lever 199 which, in turn, is pivotally coupled at 201 to a bracket 202 fixed to the plate 19. The upper end of pin 193 is rounded at 203. When no blank is in the printing station the end 203 extends slightly above the upper surface of the impression plate 31. This status is maintained by a compression spring 204 confined between the lever 199 and an arm 206 on the bracket 202. If a blank is perfectly flat or is originally warped but flattened adequately by operation of the roller 173 to be acted upon by suction at the printing station for clamped relation to the impression plate 31, the end 203 is depressed, by the blank, against the resistance of the spring 204. In this operation, a micro switch 207, having an arm 208 cooperating with the lever, is closed to energize electrical control apparatus, not shown, that causes a printing operation to be performed on the blank. If, however, some particle is on the impression plate or bottom of the blank as it is moved to the printing station and the particle is adequately large to preclude depression of the end 203 owing to the particle's presence between the blank and impression plate, then no printing operation takes place since the switch 207 is not closed. This status of the printing apparatus 6 acts as a signal for an operator of the machine to remove the foreign material without which correction air too readily finds its way into the holes 86, 86a, 86b, etc., with the result that the blank is not clamped to the impression plate.

Figure 2:
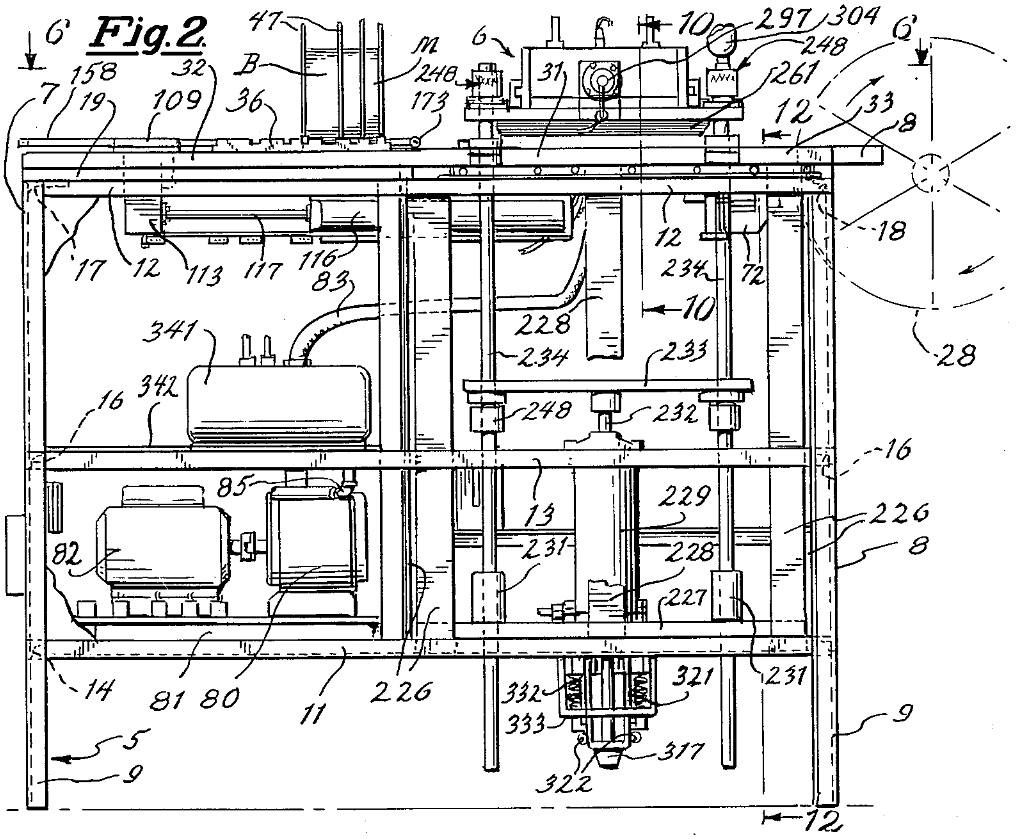
FIG. 2 is a side elevational view of the machine, the side shown being opposite the one shown in FIG. 1.

As already indicated, a blank is moved from the printing station to and off the plate 33 at the right thereof as the machine is viewed in FIG. 2. This is effected by means also indirectly coupled to the saddle 109 and comprises a pair of rods 209, FIG. 31, one of which is mounted for sliding movement in each of the slots 143 and 144. The rods 209 are also arranged to slide in a pair of slots 145, in the plate 33, of cross-section similar to the slots 143 and 144 from which the slots 145 continue to the end 7 of the frame. Like the rods 146, the rods 209 are supported for movement, longitudinally of the slots 143, 144 and 145 by a plurality of transverse, spaced-apart keys 211 of formation similar to the keys 148. For its coupled relation to the saddle, the lower sides of the rods 209 are notched at 212 adjacent the rods 146 and the latter are of depth sufficiently reduced at 213 to be overlapped by the notched portion of the rods 209. This status is maintained by screws 214 passing freely through the rods 209 and threaded in the rods 146. Adjacent their remaining ends, each of the rods 209 is notched transversely thereof at 216 and formed with a pair of spaced-apart ears 217 between which a dog 218 is pivoted at 219. The dog extends into the notch 216 where the dog's pivoted end is engaged and biased downward by a leaf spring 221, fixed at 222 to the rod 209, to bias the dog counterclockwise about its axis. The remaining free end of the dog is formed with a flange 223 extending beyond the end of the rod 209. Normally the flanged ends 223 of the dogs 218 are above the level of the plates 31 and 33 when the flanges 223 are vertical for engagement with the trailing edge of the blanks.

At the forward end of their stroke, FIG. 31, the dogs have just dislodged a printed blank from the support of the plate 33 and an unprinted blank has been moved into engagement with the stops 66. When, however, the dogs are carried backward from their forward extreme position they are first engaged by the leading edge of the unprinted blank, just referred to, and thereby rocked clockwise against force of the springs 221 so that the dogs may pass under the leading edge of the blank.

It is timely to now point out that there is always an interruption at a predetermined point in the backward motion of the saddle 109. This, of course, is accompanied by a pause in the backward movement of the dogs 218 from their forward extreme position, FIG. 31. The pause in their backward travel takes place when they are in the printing station P and are consequently depressed by a blank, if one is present therein. It is during this pause that a printing operation takes place and it is therefore one of the purposes of the pause to preclude engagement of the dogs by the screen during such an operation. Otherwise, engagement of the screen by the dogs would result in unnecessary wear on the former and inking of the latter, followed by dispersal of the ink to undesired points.

With resumption of backward motion of the dogs 218, at the end of a pause, the dogs come to a stop at their backward extreme position, FIG. 30, and in moving thereto are carried out from beneath the blank which has been just printed. This enables the flanges 223 of the dogs to assume, by force of the springs 221, positions in which they are in readiness to engage the trailing edge of the adjacent blank on their immediately next forward stroke and discharge it from the plate 33.

The pause in the backward movement of the dogs 218 and resumption of their operation besides operation of the printing head in a cycle of motion takes place in response to operation of electrical control switches later to be referred to, which govern solenoid-operated control valves to be referred to hereinafter.

It will now be apparent that a blank is moved from the magazine M to the discharge end of the printing press by three increments of motion. This is effected by three cycles of operation of the motor 116, a complete backward and forward motion of its piston rod 117 between its extreme positions constituting a cycle.

Before considering the printing apparatus 6, it is timely to first consider provisions for its support and manipulation. They are shown in FIGS. 6 and 12 wherein it will be noted that the plate 19 adjacent the corners is niched at 224. Thereat, and within the angle members 21, 22 and 26, upper ends of pairs of vertical straps 226 are received and rigidly secured. Lower ends of the straps collectively embrace the edges of a motor carrier or platform 227 to which the straps are also fixed. Laterally of the frame 5, additional straps 228 are fixed to the plate 19 and carrier 227, intermediate the straps 226. The platform affords permanent support for a vertical fluid pressure motor 229 in spaced relation to which is a plurality of vertical sleeves or bearings 231 each of which is fixed to the platform 227 adjacent one of its four corners. Each of the bearings slidably receives a shaft 234 which passes freely through a cross-head or vertically movable plate 233 releasably fixed to the shafts by means to be described hereinafter. The cross-head 233, on the other hand, is rigidly connected to movable parts of the motor 229, including a piston 230 and piston rod 232. Operation of the latter therefore moves the shafts 234 axially of the bearings 231 and when so operated the shafts also move within bushings 236 associated with the plate 19.

A concept of the features of the bushings 236 can best be acquired on reference to FIG. 35. Therein it will be noted that besides its bearing formation for the shaft 234, each of the bushings 236 is formed with a flange 237 intermediate its ends. On one side of the flange is a neck 238, of uniform diameter, while a threaded neck 239 is formed on the opposite side of the flange. The necks 238 extend downward through bores 241, in the plate 19, where the flanges 237 are clamped to the top of plate 19 by screws 242. As thus associated with the plate 19, each of the necks 239 afford support for a stop nut 244 thereon and serving as an adjustable stop relative to a plate member 246, later to be described in connection with the printing apparatus. For maintaining a selected adjustment of the nut, relative to the bushing 236, each of said nuts is formed to receive a set screw 247 for cooperation with the neck 239.

The plate 246 is releasably clamped to the shafts 234 by collet mechanism indicated in its entirety by the reference character 248 (FIG. 35). In detail, it comprises a bushing 249 to receive the shaft 234. The bushing 249 has a flange 251 at its lower end for abutment with the top of the plate 246 and in which status the bushing is maintained by screws 252 passing through the flange and threaded in the plate. Intermediate its ends, the bushings 249 is threaded at 253 to receive a nut 254. Between its threaded portion 253 and upper end, the periphery of the bushing is tapered at 256 for cooperation with a correspondingly tapered surface 257 internally of the nut 254. Additionally, that portion of the bushing above the flange 251 is formed with a plurality of longitudinal slots 258 so that with cooperation taking place between the tapered portions 256 and 257 as the nut is tightened those portions of the bushing intermediate the slots are deflected minutely and radially thereof to press against the periphery of the shaft 234. This is adequate to clamp the plate 246 to the shafts 234 so that the plate moves with the shafts.

The similar collet mechanism 248 is also used to releasably couple the shafts 234 to the cross-head 233, FIG. 12. In connection with the latter, the mechanism 248 is inverted with respect to the position it is shown in FIG. 35, since it is fixed to the bottom of the cross-head 233.

The plate 246 plays the role of carrier or movable frame for other members of the apparatus 6 including a screen frame 261. The later is rectangular and bolted to the lower side of the plate 246 at the edges of a rectangular aperture 262, FIG. 10, in the plate 261. Although a detailed description of the screen frame 261 has already been referred to, it is timely to point out that the frame 261 supports, on its lower side, the screen 4 proper which is therefore below the level of the plate 246. The plate 246 is moved downward adequately from the screen to be super-imposed on one of the blanks B, etc., at the lower extremity of its stroke. At this time ink having been administered to the upper side of the screen, the stencilled surface of the latter permits the ink to flow only through those areas above areas on the blank in which the printed configuration is desired, assisted by other means later to be described.

Ink manipulating mechanism in association with the screen will now be described. It comprises a pair of guides or rectangular plates 264, FIGS 10 and 38. They are arranged on their edges on the plate 246 and on each opposite side of the aperture 262. The guides are parallel to each other and their adjacent sides are formed with grooves 266. The purpose of the guides is to govern the course of an ink carriage 267 which comprises an upper horizontal member 268, above the level of the guides 264. To the ends of the member 268 are fixed vertical supports 269 which extend downward between the guides and are fixed to sliders 271 slidably received in the grooves 266. The members 268 and 269 therefore afford an arch structure which is further reinforced by a strap 272, the ends of which are fixed to the uprights 269. The arch structure is therefore arranged to move across the aperture 262. In so doing the arch carries over the surface of the screen other elements of the carriage 267, including wiper apparatus indicated in its entirety by the character 273.

The apparatus 273 includes a wiper carrier 274. It may be a rectangular metallic plate extending between the uprights 269 and suspended from the transverse member 268 by vertical screws 276 one of which passes freely through the member 268 adjacent either end thereof and is threaded in the carrier 274. If desired, a pair of lock nuts 277 and 278 may be employed on each of the screws 276 to maintain the vertical adjustment of the carrier 274. While so supported, one of the ends of the carrier 276 is received in a vertical groove 279 in one of the uprights 269 while the other end of the carrier is received in a vertical groove 281 in the remaining upright member. Turning the screws 276 therefore moves the carrier longitudinally of the grooves 279 and 281. As a result, a pair of wiper blades or doctor bars 282 of some resilient plastic material such as rubber are also moved vertically. The reason for this is, of course, the coupled relationship between the blades 282 and the carrier 274. For this relationship, opposed sides of the bars 282 are embraced, for a portion of their height, by bar holders 283 of inverted U-shaped cross section in which status the doctor bars are pinned to the holders. Also, opposite ends of the holders 283 is each provided with a pintle 284, FIG. 39, journaled in a bore 285 of a flange 286 adjacent the ends of the carrier 274. Each of the pintles 284 is movable longitudinally thereof in a bore 287 within predetermined limits provided by a handle 288 extending laterally of the pintle through a slot 289 in the holder 283. While supporting the holders and doctor bars, the pintles 284 are in their extended position. This is provided by the biasing effect of a compression spring 291, FIG. 39, confined in each of the bores 287 between the bottom thereof and the pintle 284 therein. Under the influence of the springs 291 the handles 288 abutting the outer ends of the slots 289 limit the outward movement of the pintles. For cleaning the doctor bars or for replacing them, the handles 288 are grasped and moved to the opposite ends of the slots 289. This moves the pintles 284 against the resistance of the springs 291 until the pintles are disengaged from the bores 285. The doctor bars and holders may then be removed from the ink carriage 267.

It will now be apparent that the doctor blades 282 are free to swing about the pintles 284. This motion is within predetermined limits, however, since the outward sides of the holders 283 carry fingers 292 extending upwardly and bear adjustable stops taking the form of screws 293 threaded in the fingers and arranged to engage the carrier 274 when the blades 282 are swung in one direction about their axes provided by the pintles. If desired, lock nuts 294 may be used on the screws 293 to preserve given adjustments thereof by cooperating with the fingers 292.

Means for limiting the proximity of one of the doctor bars 282 to the other bar is also a feature of the inking mechanism during movement of the ink carriage 267. For this to be carried out, one of the holders 283 bears a roller bearing 295, FIG. 34, on its side adjacent the other holder and the bearing, in turn, carries a roller 296 for engaging said other holder and maintaining a state of parallelism between the holders during motion of the ink carriage, the roller serving as an antifriction element therebetween.

The ink carriage is arranged to be oscillated by a fluid pressure motor 297, FIG. 10. It is rigidly secured to an arm 298 on the plate 246. The motor 297 has a piston rod 299, FIG. 38, the outward end of which is threaded in a block 301. The strap 272, on the other hand, bears fixed thereto a section of channel iron 302 having flanges 303 between which the block 301 is fixed.

Ink for printing on the blanks is contained in a supply tank 304, FIG. 13. It may be pointed on any one of the shafts 234 at the top thereof. The tank 304 is formed with an opening, not shown, at the top thereof which is normally closed by a plug 306 to hermetically seal the tank. This is because air, at an elevated pressure, is introduced into the tank 304 above the surface of the ink therein, by way of a supply tube 307 and pipe fitting 308. The ink contained in the tank 304 is transferred therefrom by a flexible tube 309, connected to the base of the tank 304 by a suitable fitting 311, and to a rigid tube 312 by a pipe fitting 313, FIG. 38. The tube 312 is rigidly supported from the carrier 274 and bears at its lower end an ink rail or ink spreader 314 extending horizontally between the wiper holders 283. The spreader 314 may take the form of a pipe which is closed at both ends and which is formed, at its lower side, with a plurality of apertures 316 through which ink is exuded by air pressure in the tank 304.

During operation of the printing machine air is admitted to the tank 304 through an adjustable stricture valve, not shown, at a rate determined by test. The ink then accumulates in a small quantity on the screen 263 between the flexible wipers 282. As the latter are carried backward and forward by reciprocatory operation of the ink carriage 267, the wipers are bent slightly and the ink is spread upon the screen and is urged through the screen to print a blank thereunder.

A feature for augmenting spreading of the ink evenly over the surface of the screen is indicated in FIGS. 23 and 38. Therein it will be noted that the carrier is arranged to extend in a diagonal direction beneath the member 268. For this to be possible the grooves 279 and 281 are arranged adjacent to diagonally opposite edges of the uprights 269. This arrangement augments movement of the ink longitudinally of the space between the wipers 282 as the latter are operated so that the ink is more evenly spread over the surface of the screen during operation of the motor 297.

Although the printing apparatus 6 is arranged for vertical movement through but a short distance, after the order of an inch in operation of the machine for printing on blanks, the apparatus is arranged to move vertically to a much greater degree. This is desirable in order that the screen 263 may be occasionally replaced. When this is advisable, the frame 261 must be removed, which operation calls for additional space between the impression plate 31 and the plate 246. To provide the additional space, the piston rod 232, FIG. 12, of the motor 229 extends through the lower end thereof, through the platform 227 and bears at its lower end a head or stop 317. On either side of the piston rod 232 is a bracket 318 extending downward from the platform 227. Both of the brackets have pivoted thereto at 319 normally vertical levers 321 which bear pins 322 at their lower ends to which a tension spring 323 is connected to bias the lower ends of the arms 321 over the head 317 so that upward motion of the piston rod is limited. During a printing operation, the head 317 is moved downward into spaced relation to the arms 321 as the screen is lowered into printing cooperation with a blank. Intermediate the fulcrums 319 and the pins 322 is a pair of followers 324, one of which is on each of the arms 321. The followers are for concurrent cooperation with a cam 326 carried by a lever 327 which is pivoted at 328 to a bracket 329 on the platform 227. The bracket 329 is at one side of the frame from which the lever 327 extends to and beyond the opposite side of the frame where the lever bears a stirrup 331. The lever 327 is biased upward about its fulcrum by a compression spring 332 supported between lower side of the platform 227. When occasion arises to remove the screen 263 an operator of the machine uses the central portion of a U-shaped bracket 333 fixed to the his foot to depress the stirrup 331, FIG. 12*a*, and swing the lever 327 downward against the force of spring 332. During this operation the pins 322 are moved away from each other by their cooperation with the cam 326, accompanied, of course, by swinging of the arms 321 outward about their pivots 319. This removes the lower ends of the arms 321 from their stopping relation to the head 317 so that fluid pressure now applied to the bottom of the piston 230 serves to elevate the printing apparatus 6 adequately for the screen frame 261 to be removed and then replaced after a change of screens has been effected.

As previously indicated, the screen 263 is pressed against a blank during a printing operation. An impression is thus repeatedly made on the screen by the blanks whose comparatively sharp linear corners at the junctions of their top and edge surfaces could exert abnormal wearing effect on linear regions of the screen above these portions of the blanks. Therefore, a pair of filler plates 334, FIG. 21, of thickness approximately equal to the thickness of a blank is provided for association with the impression plate 31, one of the plates being removably affixed thereto on either side of the printing station by screws 336. The edges of the plates 334, adjacent the printing station are formed with notches 337 arranged to straddle the fence pins 49 and 51 so that the plates may be more intimately associated with the adjacent edges of a blank in the printing station. Due to the plates 334, the downward pressure of the screen is distributed over a larger area and not being localized over the area of a blank alone, the life of the screen is extended.

A brief summary of the operation before proceeding with the detailed description of the electrical circuit which makes the automatic operation possible is as follows:

A plurality of printed circuit boards having been placed in the magazine, the machine is set in operation, the pneumatic motor 116 operates to eject a blank which is moved out to a first position between the printing table and the magazine, on the next cycle of the cylinder, and the board is stopped in a predetermined position on the printing table by the stop pins. Each time the ejector reaches the end of its travel, the motor 116 is reversed and starts on its return path toward the magazine. Approximately half-way back towards the magazine, the motor is shut off and the carriage coasts to a stop. At this time the ejectors 218 are under the circuit board. At the same time that the carriage started back, the printing head started down carrying the printing screen toward the board. On the way down it caused the board guide pins to be moved out of the way of the inking carriage; at the time the screen touches the board the inking carriage is caused to be moved across the screen with a squeegee action forcing the ink through the screen onto the board. As the squeegee reaches the end of its travel, the printing head is raised and it, in turn, causes the pneumatic motor 116 to complete its return stroke toward the magazine, where it is in a position to engage another board in the magazine, and to move another board into printing position. At this time the ejectors 218 are ready to pick up the freshly inked board, which they do on the next stroke of the carriage, the printed board being slid along the bed to the conveyor at the end and the new board being positioned under the printing head, and a board ejected from the magazine, after which the operation is repeated.

In order to effect the above operation, automatically suitable switches are provided, which are used to cause the energization of solenoid valves in proper relation to effect a proper coordination of the various parts. The circuit diagram illustrating the switches, solenoids and their connection, is illustrated in FIG. 40.

The power line 400 is connected through a manually operated switch 401 to a step-down transformer 403 which supplies operating current to the circuit. The motor 82 is energized from the power line through the switch 402.

One side of the transformer secondary is grounded and the other side connected through a line 404 to a single pole double throw switch 338, the operating handle 339 of which can be thrown to set the machine for manual or automatic operation. The circuit is so arranged that substantially any of the separate operations of the machine may be controlled singly for adjustment purposes. The handle 339 being moved to the "automatic" position current is supplied to lines 405 and 406 which supply current to a plurality of switches indicated in the lower right and the upper left portions of the diagram, respectively.

It being assumed that a plurality of printed circuit boards have been previously placed in the magazine, the energization of the circuit automatically causes the ejector cylinder 116, FIG. 41, to operate, since air is admitted thereto from an air supply source 410 by way of line 411 through a first "half stroke" valve mechanism 412 and by line 413 to a main two-way valve 414 which connects by lines 415 and 416 to opposite ends of the cylinder 116. The valves may all be of standard commercial construction and comprise a valve body 414 having an air inlet **414*a* and a pair of air outlets 414*b* and 414*c*. The internal valve mechanism is shifted, so as to direct air pressure from the inlet to either one of the outlets by energized solenoids 414*d* and 414*e*** which are disposed on the ends of the valve body.

The solenoids **414*d* and 414*e* are alternately energized by limit switches 414*f* and 414*g* which are operated by a pin or lug 347 carried on the arm 113, FIGS. 8 and 14, which is connected to the rod 117 of the motor cylinder 116 to energize the solenoids 414*d* and 414*e* at each end of the stroke to cause a reversal of the valves, which in turn reverses the travel of the piston. It being assumed that the ejector is in a position to move a printed circuit board from under the stack in the magazine, at which time the piston rod is extended and the solenoid 414e having just been energized upon the outward stroke of the piston rod 117 to complete a circuit from the line 406 through the limit switch 414g to the line 420 to energize the solenoid 414e, air is admitted through the line 415 of the cylinder and the piston in the cylinder 116** therefore moves inward and a printed circuit board is ejected from the magazine.

As the piston rod moves inward or to the right, the operator 347, FIG. 8, strokes the operating member of a switch 430, which energizes the line 430a to operate a valve solenoid 430b to cause the stop pins 66 to be raised by the motor 73, the valve controlled by the solenoid 430b controlling air to the cylinder of motor 73. Continued movement of the carriage causes the actuation of the carriage reversing switch 414f to cause the carriage to start on its backward travel, since the switch 414f energizes the solenoid 414d which reverses the valve and admits air to the line 416. The switch 414f has combined therewith a switch 440 which is operated at the same time to energize the solenoid 440a which actuates the valve that admits air to the top of the cylinder 229 to move the screen carrier down, bringing the screen into contact with the circuit board blank.

Figure 1:
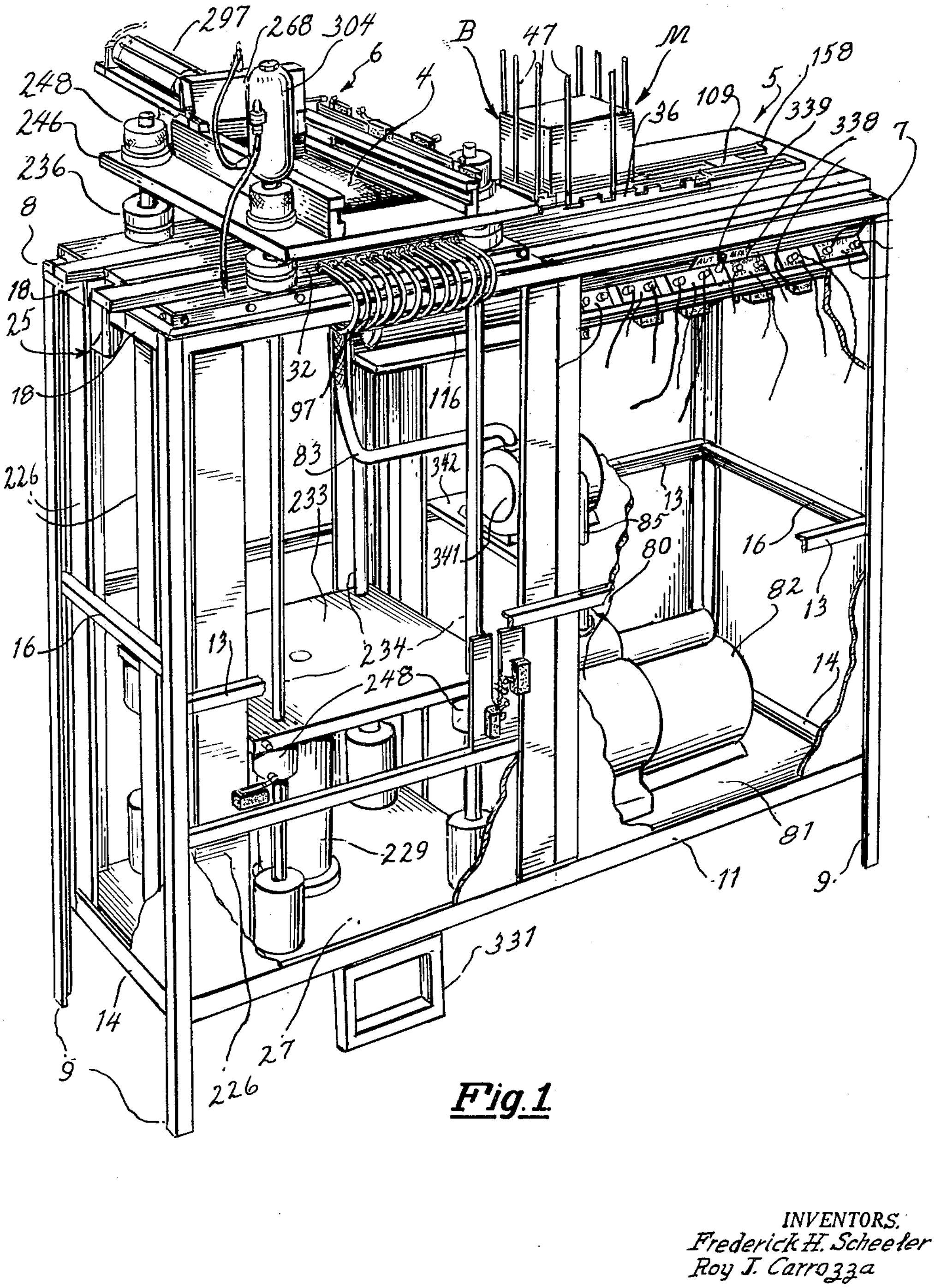
FIG. 1 is a perspective view of the machine in which the invention is incorporated.

In its downward travel the screen carrier switch operating pin 350, FIG. 1, operates a switch 430c which closes a circuit to the solenoid 430d causing the stop pins to be lowered by the motor 73. As the screen carriage continues downward it operates a switch 450 which is in series with two switches 450a and 450b that are connected to the squeegee solenoids 450c and 450d that control the valve for operating the cylinder 297, FIG. 1. The switch 450 only closes instantaneously, at which time it makes a circuit connecting either of the switches 450a or 450b to the solenoid valve. These two valves are disposed to control air to opposite ends of the screen carriage piston so that one of them causes the squeegee to move in one direction for one stroke and the other in the other direction for its back stroke so that the squeegee only travels once over the screen for each printing operation.

The cylinder on its backward stroke engages the switch 414k causing the solenoid 412a to be energized and operates the half stroke valve 412, disposed in the line to valve 414, to shut off the air to line 414 and causes the carriage to come to a stop, at this time the ejector fingers are under the board where they do not become engaged by the printing screen and, therefore, do not cause any wear or damage thereto.

As the squeegee reaches the end of its stroke it operates a sswitch 440b that energizes the solenoid 440c and causes the screen carriage to be moved up.

On the upward stroke of the screen carriage a switch 414m actuates a hopper start and stop solenoid 414n for the valve, the output of which is connected in parallel with the valve 414 to cause the piston in cylinder 116 to complete its return stroke. The piston then operates the switch 414f, which energizes the solenoid 414e and at the same time actuates the solenoid 412b of the half-stroke valve to open that valve so that the valve 414 is effective to start the operation on the next cycle of operation. As previously stated, the individual functions of the various parts of the apparatus may be effected by moving the switch 339 to the manual position, in which event the main line 404 is connected to the line 350 which provides a common "hot" lead to all of a plurality of manual switches that may be of the push to close type.

The printing screen may be raised or lowered by actuating the switches 351a or 351b, respectively, which cause current to be supplied to the solenoids 440c or 440a, respectively.

The hopper carriage may be moved in and out by actuating the switches 352a and 352b, respectively, to energize the solenoids 414d and 414e, respectively.

The ink spreading squeegee may be moved backward and forward by operating the switches 353a and 353b, respectively, which supply current to the valve solenoids 450c and 450d, respectively.

Likewise the stop pins 66 may be operated by the switches 354a and 354b to actuate the stop valve solenoid 430b and 430d.

The ink supply switch 355 actuates the ink solenoid 356, as also does the switch 357 on top of the ink carriage which is operated cyclically upon reciprocation of the squeegee.

The magazine start and stop switch 360a and 360b connects to the start and stop solenoids 414n and 361. As previously stated, these switches enable the operation of the ejecting cylinder 116 to be controlled and to permit starting and stopping of it at any point in its travel.

The switch 207, FIG. 33, is a normally open switch that is disposed in series with the switch 414g to render that switch ineffective in the event the circuit board is not in intimate contact with the bed, as previously described.

Having thus described our invention in an embodiment thereof, we are aware that numerous and extensive departures may be made therefrom without departing from the spirit of the invention, as defined in the appended claims.

We claim:

1. In a printing press, an impression plate to provide a horizontal course through which a plate-like blank may be slid and a printing station in said course, a stop normally in said course to preclude passage of the blank beyond said station when slid thereto, said plate being formed at said station with a cluster of apertures through which vacuum may be communicated to the blank to secure it to said plate when engaging said stop, motive means for operating printing mechanism above said station, a switch in circuit with said motive means, linkage including a projecting member between said station and said switch, said member being journaled for vertical movement in said plate and being biased for depression by said blank when the latter is drawn by said vacuum into operative engagement with said plate for operation of said switch to carry out a printing operation but remaining in its upward position when vacuum is ineffective for drawing said blank into operative engagement with said plate due to a defect in the structure of said blank, said stop being timed to be retracted from said course subsequent to engagement of said stop by said blank for said mechanism to be operated without interference with said stop and the blank slid through the remainder of its course by passing freely over the stop.

2. In a machine for screen printing, a support on which a printable plate may be slid to a clamping point, a vertically movable guide carrier below said plate support, a plurality of guides fixed to said guide carrier, means biasing said guide carrier to an upper position for the guides to extend above the level of said support and provide a course between said guides for a plate to pass to said clamping point, a screen carrier above said support, a plurality of spacers on one of the carriers extending toward the other carrier, said screen carrier being movable vertically from an upper position above the level of said support wherein the spacers are spaced from said guide carrier to a lower position for moving said guides out of their guiding status by engaging said guide carrier and depressing it for a screen carried by said screen carrier to be carried downwardly into operative relationship to a plate at said clamping point without interference by said guides.

3. In a machine for screen printing, a support on which a printable plate-like blank may be slid to a clamping point, a vertically movable guide carrier below said blank support, a plurality of guides, said carrier being formed to releasably retain said guides at selected pairs of spaced rows of points, alternately selected rows of points differing in spacing for the guides to accommodate blanks differing in width between said guides; means biasing said carrier to an upper position for the guides to extend above the level of said support and provide a course for a blank to pass in to said clamping point, a screen carrier above said support, and a plurality of spacers on one of the carriers for cooperation with the other carrier, said screen carrier being movable vertically from an upper position above the level of said support wherein the spacers are spaced from said guide carrier to a lower position for moving said guides out of their guiding status by engaging said guide carrier and depressing it for a screen carried by said screen carrier to be carried downwardly into operative relationship to a plate at said clamping point without interference by said guides.

4. A machine for screen printing on a rigid planar member comprising a planar support on which the member may be slid to a printing position on said support; a vertically movable guide carrier on one side of the support, a screen carrier on the opposite side of the support, a pair of rows of guide pins on said guide carrier, said pins being arranged to extend freely through said support from one side thereof, means biasing said guide carrier into engagement with said support for the pins to extend beyond the surface of the opposite side of said support and confine a member to a predetermined course for said member to travel in when passing to its printing position, a motive unit, a linkage connecting said motive unit to the screen carrier for supporting the latter above the level of a member in printing position and for moving a screen carried by said screen carrier into printing engagement with said member, a plurality of spacer pins carried by one of the carriers, said spacer pins being out of engagement with said other carrier when said screen is spaced from said member but arranged to be engaged by said other carrier when said screen is moved toward said member and to move the guides to positions at least flush with the surface of said support before printing engagement takes place between said screen and said member by pressing said other carrier away from said support thereby for said screen to move into printing relation to said member without being engaged by said guide pins.

5. A printing press comprising a frame providing a horizontal impression surface whereon a plate-like blank may be printed, a printing head mounted to move vertically above the surface, a fluid pressure motor having a vertically operable piston rod from which the head is supported, an abutment on said rod, a latch element in pivoted relation to the frame and biased into the course of the abutment for normally limiting the upward movement of said head to a low elevation by engaging said abutment when the latter is moved upward, a treadle lever supported from the frame and extending past said element and being biased to a normal position, a cam member, a follower member, one of said members being on said lever and the other member being on said element, said follower being disengaged from said cam when said lever is in its normal position but arranged to be in cooperative engagement with the cam when said lever is manually moved away from its normal position whereby said latch is moved out of the course of said abutment and free the abutment and the motor arranged to move said head to a high elevation relative to said surface for replacement of elements of said head, said latch being restored to the course of said abutment when the lever has been returned to its normal position and said head returned to low elevation relative to said surface.

References Cited in the file of this patent

UNITED STATES PATENTS

| | | |
|---|---|---|
| 1,776,459 | Tull | Sept. 23, 1930 |
| 1,832,828 | Borregard | Nov. 17, 1931 |
| 1,922,710 | Owens | Aug. 15, 1933 |
| 2,060,082 | Johnson et al. | Nov. 10, 1936 |
| 2,196,678 | Klopfenstein | Apr. 9, 1940 |
| 2,231,535 | Jackson et al. | Feb. 11, 1941 |
| 2,383,947 | Wensel et al. | Sept. 4, 1945 |
| 2,518,042 | Martell | May 13, 1947 |
| 2,677,543 | Ohrn | May 4, 1954 |
| 2,680,614 | Gibson | June 8, 1954 |
| 2,747,502 | Gattuso | May 29, 1956 |

FOREIGN PATENTS

| | | |
|---|---|---|
| 408,907 | Great Britain | Apr. 19, 1934 |